US012782759B2

(12) United States Patent
Nogiwa

(10) Patent No.: US 12,782,759 B2
(45) Date of Patent: Nov. 3, 2026

(54) LASER DEVICE AND ELECTRONIC DEVICE MANUFACTURING METHOD

(71) Applicant: Gigaphoton Inc., Tochigi (JP)

(72) Inventor: Seiji Nogiwa, Oyama (JP)

(73) Assignee: Gigaphoton Inc., Tochigi (JP)

( * ) Notice: Subject to any disclaimer, the term of this patent is extended or adjusted under 35 U.S.C. 154(b) by 88 days.

(21) Appl. No.: 19/044,183

(22) Filed: Feb. 3, 2025

(65) Prior Publication Data

US 2025/0180933 A1 Jun. 5, 2025

Related U.S. Application Data

(63) Continuation of application No. PCT/JP2023/024268, filed on Jun. 29, 2023.

(51) Int. Cl.
*G02F 1/01* (2006.01)
*G03F 7/00* (2006.01)
(Continued)

(52) U.S. Cl.
CPC .......... *G02F 1/0121* (2013.01); *G03F 7/2004* (2013.01); *G03F 7/70025* (2013.01);
(Continued)

(58) Field of Classification Search
CPC ............... G03F 7/2004; G03F 7/70025; G03F 7/70041; G03F 7/70575; G02F 1/0121;
(Continued)

(56) References Cited

U.S. PATENT DOCUMENTS 5,760,408 A 6/1998 Kikuchi et al.
8,630,036 B2 * 1/2014 Munroe .............. H01S 3/10092 359/337

(Continued)

FOREIGN PATENT DOCUMENTS

JP 2004-086193 A 3/2004
JP 2019-529881 A 10/2019
WO 2018/057468 A1 3/2018

OTHER PUBLICATIONS

International Search Report issued in PCT/JP2022/034458; mailed Nov. 22, 2022.

(Continued)

*Primary Examiner* — Deoram Persaud
(74) *Attorney, Agent, or Firm* — Studebaker Brackett PLLC

(57) ABSTRACT

A laser device includes a semiconductor laser outputting continuous light, a first amplifier amplifying the continuous light and converting the continuous light to pulse light in synchronization with a light emission trigger signal received from an external apparatus, an optical phase modulator arranged on an optical path of the continuous light between the semiconductor laser and the first amplifier, a modulation signal generator outputting a modulation signal to be provided to the optical phase modulator, and a processor controlling the modulation signal generator. The processor causes the modulation signal generator to generate the modulation signal having an identical pattern in synchronization with the light emission trigger signal and provide the modulation signal to the optical phase modulator so as to modulate a wavelength of the continuous light within a time period corresponding to one pulse of the pulse light and adjust a spectral line width of the pulse light.

29 Claims, 19 Drawing Sheets

(51) Int. Cl.

| | |
|---|---|
| ***G03F 7/20*** | (2006.01) |
| ***H01S 3/10*** | (2006.01) |
| ***H01S 3/225*** | (2006.01) |
| ***H01S 5/00*** | (2006.01) |

(52) U.S. Cl.

CPC ...... *G03F 7/70041* (2013.01); *G03F 7/70575* (2013.01); *H01S 3/10092* (2013.01); *H01S 5/0085* (2013.01); *H01S 5/0092* (2013.01); *G02F 2203/50* (2013.01); *H01S 3/225* (2013.01)

(58) Field of Classification Search

CPC .. G02F 2203/50; H01S 3/10092; H01S 3/225; H01S 5/0085; H01S 5/0092; H01S 3/0085; H01S 3/2308; H01S 3/2375; H01S 5/0683

See application file for complete search history.

(56) References Cited

U.S. PATENT DOCUMENTS

| | | | | |
|---|---|---|---|---|
| 2012/0002688 | A1 | 1/2012 | Munroe | |
| 2016/0240993 | A1* | 8/2016 | Tokuhisa | G02F 1/353 |
| 2018/0269645 | A1* | 9/2018 | Cannon | H01S 3/0912 |
| 2018/0309258 | A1* | 10/2018 | Honninger | H01S 3/10015 |
| 2019/0157833 | A1* | 5/2019 | Suganuma | G03F 7/70033 |
| 2019/0363504 | A1* | 11/2019 | Onose | G02F 1/37 |
| 2020/0335928 | A1 | 10/2020 | Underwood, III | |
| 2021/0226411 | A1* | 7/2021 | Miura | G02F 1/37 |
| 2024/0291220 | A1* | 8/2024 | Nogiwa | G02F 1/3551 |
| 2026/0081399 | A1* | 3/2026 | Motosugi | H01S 5/0085 |

OTHER PUBLICATIONS

International Search Report issued in PCT/JP2023/024268; mailed Aug. 15, 2023.

International Preliminary Report on Patentability and Written Opinion issued in PCT/JP2022/034458; on Mar. 1, 2025.

International Preliminary Report on Patentability and Written Opinion issued in PCT/JP2023/024268; on Mar. 1, 2025.

* cited by examiner

FIG. 7

| Clock | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| $Q_0$ | 0 | 1 | 1 | 1 | 0 | 1 | 1 | 0 | 0 | 1 | 0 | 1 | 0 | 0 | 0 | 0 |
| $Q_1$ | 0 | 0 | 1 | 1 | 1 | 0 | 1 | 1 | 0 | 0 | 1 | 0 | 1 | 0 | 0 | 0 |
| $Q_2$ | 0 | 0 | 0 | 1 | 1 | 1 | 0 | 1 | 1 | 0 | 0 | 1 | 0 | 1 | 0 | 0 |
| $Q_3$ | 0 | 0 | 0 | 0 | 1 | 1 | 1 | 0 | 1 | 1 | 0 | 0 | 1 | 0 | 1 | 0 |
| $Q3 \oplus Q2 \oplus 1$ | 1 | 1 | 1 | 0 | 1 | 1 | 0 | 0 | 1 | 0 | 1 | 0 | 0 | 0 | 0 | 1 |

$\oplus$ : Xor

LASER DEVICE AND ELECTRONIC DEVICE MANUFACTURING METHOD

CROSS-REFERENCE TO RELATED APPLICATIONS

The present application the claims benefit of International Application No. PCT/JP2023/024268 filed Jun. 29, 2023, which claims priority to International Application No. PCT/JP2022/034458 filed Sep. 14, 2022. Each of the above applications is hereby expressly incorporated by reference, in its entirety, into the present application.

BACKGROUND

1. Technical Field

The present disclosure relates to a laser device and an electronic device manufacturing method.

2. Related Art

Recently, in a semiconductor exposure apparatus, improvement in resolution has been desired for miniaturization and high integration of semiconductor integrated circuits. For this purpose, an exposure light source that outputs light having a shorter wavelength has been developed. For example, as a gas laser device for exposure, a KrF excimer laser device for outputting laser light having a wavelength of about 248 nm and an ArF excimer laser device for outputting laser light having a wavelength of about 193 nm are used.

The KrF excimer laser device and the ArF excimer laser device each have a large spectral line width of about 350 to 400 pm in natural oscillation light. Therefore, when a projection lens is formed of a material that transmits ultraviolet rays such as KrF laser light and ArF laser light, there is a case in which chromatic aberration occurs. As a result, the resolution may decrease. Then, a spectral line width of laser light output from the gas laser device needs to be narrowed to the extent that the chromatic aberration can be ignored. For this purpose, there is a case in which a line narrowing module (LNM) including a line narrowing element (etalon, grating, and the like) is provided in a laser resonator of the gas laser device to narrow a spectral line width. In the following, a gas laser device with a narrowed spectral line width is referred to as a line narrowing gas laser device.

LIST OF DOCUMENTS

Patent Documents

Patent Document 1: U.S. Pat. No. 5,760,408
Patent Document 2: US Patent Application Publication No. 2021/0226411

SUMMARY

A laser device according to an aspect of the present disclosure includes a semiconductor laser configured to output continuous light, a first amplifier configured to amplify the continuous light and convert the continuous light to pulse light in synchronization with a light emission trigger signal received from an external apparatus, an optical phase modulator arranged on an optical path of the continuous light between the semiconductor laser and the first amplifier, a modulation signal generator configured to output a modulation signal to be provided to the optical phase modulator, and a processor configured to control the modulation signal generator. Here, the processor causes the modulation signal generator to generate the modulation signal having an identical pattern in synchronization with the light emission trigger signal and provide the modulation signal having the identical pattern to the optical phase modulator so as to modulate a wavelength of the continuous light within a time period corresponding to one pulse of the pulse light and adjust a spectral line width of the pulse light.

An electronic device manufacturing method according to another aspect of the present disclosure includes generating laser light having an ultraviolet wavelength using a laser device, outputting the laser light to an exposure apparatus, and exposing a photosensitive substrate to the laser light in the exposure apparatus to manufacture an electronic device. Here, the laser device includes a semiconductor laser configured to output continuous light, a first amplifier configured to amplify the continuous light and convert the continuous light to pulse light in synchronization with a light emission trigger signal received from an external apparatus, an optical phase modulator arranged on an optical path of the continuous light between the semiconductor laser and the first amplifier, a modulation signal generator configured to output a modulation signal to be provided to the optical phase modulator, a processor configured to control the modulation signal generator, and a wavelength conversion system configured to output second pulse laser light as converting a wavelength of first pulse laser light output from the first amplifier. The processor causes the modulation signal generator to generate the modulation signal having an identical pattern in synchronization with the light emission trigger signal and provide the modulation signal having the identical pattern to the optical phase modulator so as to modulate a wavelength of the continuous light within a time period corresponding to one pulse of the pulse light and adjust a spectral line width of the pulse light.

A laser device according to another aspect of the present disclosure includes a semiconductor laser configured to output continuous light, a first amplifier configured to amplify the continuous light and convert the continuous light to pulse light in synchronization with a light emission trigger signal received from an external apparatus, an optical phase modulator arranged on an optical path of the continuous light between the semiconductor laser and the first amplifier, a modulation signal generator configured to output a modulation signal to be provided to the optical phase modulator, and a processor configured to control the modulation signal generator. Here, the processor causes the modulation signal generator to generate the modulation signal having an identical pattern in synchronization with the light emission trigger signal and provide the modulation signal having the identical pattern to the optical phase modulator so as to modulate a wavelength of the continuous light within a time period corresponding to one pulse of the pulse light, and to adjust a power of the modulation signal so as to adjust a spectral line width of the pulse light.

An electronic device manufacturing method according to another aspect of the present disclosure includes generating laser light having an ultraviolet wavelength using a laser device, outputting the laser light to an exposure apparatus, and exposing a photosensitive substrate to the laser light in the exposure apparatus to manufacture an electronic device. Here, the laser device includes a semiconductor laser configured to output continuous light, a first amplifier configured to amplify the continuous light and convert the continuous light to pulse light in synchronization with a light emission trigger signal received from an external apparatus, an optical phase modulator arranged on an optical path of the continuous light between the semiconductor laser and the first amplifier, a modulation signal generator configured to output a modulation signal to be provided to the optical phase modulator, and a processor configured to control the modulation signal generator. Here, the processor causes the modulation signal generator to generate the modulation signal having an identical pattern in synchronization with the light emission trigger signal and provide the modulation signal having the identical pattern to the optical phase modulator so as to modulate a wavelength of the continuous light within a time period corresponding to one pulse of the pulse light, and to adjust a power of the modulation signal so as to adjust a spectral line width of the pulse light.

BRIEF DESCRIPTION OF THE DRAWINGS

Embodiments of the present disclosure will be described below merely as examples with reference to the accompanying drawings.

FIG. 7 is a truth table of the pseudo-random signal generator shown in FIG. 6.

DESCRIPTION OF EMBODIMENTS

Contents

Figure 1:
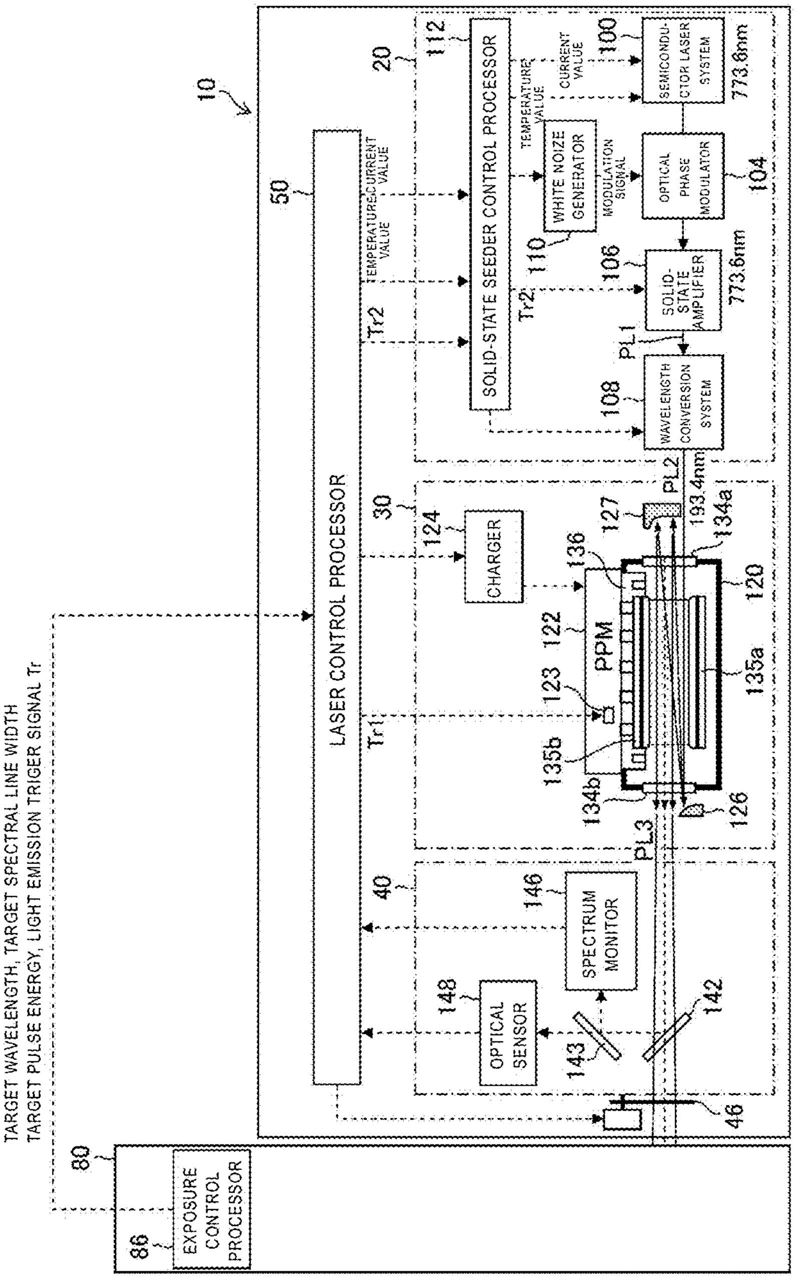
FIG. 1 schematically shows the configuration of a laser device according to a comparative example.

1. Overview of laser device according to comparative example
   - 1.1 Configuration
   - 1.2 Operation
   - 1.3 Problem
2. First Embodiment
   - 2.1 Configuration
   - 2.2 Operation
   - 2.3 Specific example of pseudo-random signal generator
   - 2.4 Example of time chart
   - 2.5 Effect
3. Second Embodiment
   - 3.1 Configuration
   - 3.2 Operation
   - 3.3 Description of change of optical spectral shape
   - 3.4 Effect
4. First modification of solid-state seeder
   - 4.1 Configuration
   - 4.2 Operation
5. Second modification of solid-state seeder
   - 5.1 Configuration
   - 5.2 Operation
6. Other modifications
7. Electronic device manufacturing method
8. Third Embodiment
   - 8.1 Configuration
   - 8.2 Operation
   - 8.3 Effect
9. Fourth Embodiment
   - 9.1 Configuration
   - 9.2 Operation
   - 9.3 Effect
10. Fifth Embodiment
    - 10.1 Configuration
    - 10.2 Operation
    - 10.3 Effect
11. Example of optical phase modulator
12. Combination of exposure apparatus and laser device
13. Others Hereinafter, embodiments of the present disclosure will be described in detail with reference to the drawings. The embodiments described below show some examples of the present disclosure and do not limit the contents of the present disclosure. Also, all configurations and operation described in the embodiments are not necessarily essential as configurations and operation of the present disclosure. Here, the same components are denoted by the same reference numeral, and duplicate description thereof is omitted.

1. Overview of Laser Device According to Comparative Example

1.1 Configuration

FIG. 1 schematically shows the configuration of a laser device 10 according to a comparative example. The comparative example of the present disclosure is an example recognized by the applicant as known only by the applicant, and is not a publicly known example admitted by the applicant.

The laser device 10 includes a solid-state seeder 20 as a master oscillator (MO), an excimer amplifier 30 as a power amplifier (PA), a monitor module 40, an outlet port shutter 46, and a laser control processor 50.

The solid-state seeder 20 includes a semiconductor laser system 100 for outputting continuous wave (CW) light, an optical phase modulator 104, a solid-state amplifier 106, a wavelength conversion system 108, a white noise generator 110, and a solid-state seeder control processor 112.

The semiconductor laser system 100 includes a distributed feedback (DFB) type semiconductor laser that outputs CW laser light having a wavelength of about 773.6 nm. The semiconductor laser system 100 has a configuration in which the oscillation wavelength can be changed by controlling a temperature value of a semiconductor laser and/or a current value flowing through an element of the semiconductor laser.

The optical phase modulator 104 modulates the phase of CW light output from the semiconductor laser system 100. The white noise generator 110 superimposes a modulation signal on the optical phase modulator 104.

The solid-state amplifier 106 converts output light of the optical phase modulator 104 to pulse light and amplifies the pulse light. The solid-state amplifier 106 includes a semiconductor optical amplifier (SOA), a titanium sapphire crystal, and a pumping pulse laser. By supplying pulse current to the SOA, the SOA pulse-amplifies the CW light output from the optical phase modulator 104, and outputs pulse-amplified pulse laser light. The titanium sapphire crystal is arranged on the optical path of the pulse laser light pulse-amplified by the SOA. The pumping pulse laser is a laser device for outputting second harmonic light of a YLF laser. Yttrium lithium fluoride (YLF) is a solid-state laser crystal represented by the chemical formula LiYF4. The solid-state amplifier 106 may include a fiber amplifier instead of or in combination with the amplifier using the titanium sapphire crystal.

The wavelength conversion system 108 includes a nonlinear crystal, performs wavelength conversion on the incident pulse laser light to cause second harmonic generation twice, and generates pulse light having an optical frequency four times that of the incident pulse laser light. The wavelength conversion system 108 includes, for example, an LBO crystal and a KBBF crystal. "LBO" is represented by the chemical formula $LiB_3O_5$. "KBBF" is represented by the chemical formula $KBe_2BO_3F_2$. The wavelength conversion system 108 converts the wavelength of pulse laser light PL1 output from the solid-state amplifier 106 and outputs pulse laser light PL2 having a wavelength of about 193.4 nm.

The solid-state seeder control processor 112 controls the wavelength, power, pulse waveform, spectral line width, and the like of the laser light output from the solid-state seeder 20. The solid-state seeder control processor 112 controls the semiconductor laser system 100, the solid-state amplifier 106, the wavelength conversion system 108, and the white noise generator 110 based on input from the laser control processor 50. The processor in the present specification is a processing device including a storage device in which a control program is stored and a central processing unit (CPU) that executes the control program. The processor is specifically configured or programmed to perform various processes included in the present disclosure.

The excimer amplifier 30 includes a chamber 120, a pulse power module (PPM) 122, a charger 124, a convex mirror 126, and a concave mirror 127. The chamber 120 includes windows 134*a*, 134*b*, a pair of electrodes 135*a*, 135*b*, and an electrically insulating member 136. An ArF laser gas is supplied into the chamber 120 from a gas supply device (not shown). The ArF laser gas includes an Ar gas, an $F_2$ gas, and an Ne gas.

The PPM 122 includes a switch 123 and a charging capacitor (not shown). The charger 124 holds electric energy to be supplied to the PPM 122. The charger 124 is connected to the charging capacitor (not shown). The charger 124 charges the charge capacitor of the PPM 122 in accordance with a command from the laser control processor 50.

The PPM 122 is connected to the electrode 135*b* in the chamber 120 via a feedthrough in the electrically insulating member 136. The electrode 135*a* is connected to the ground potential.

The windows 134*a*, 134*b* are arranged such that the pulse laser light amplified by discharge excitation between the electrodes 135*a*, 135*b* passes therethrough.

The convex mirror 126 and the concave mirror 127 are arranged such that the pulse laser light PL2 output from the wavelength conversion system 108 passes through the discharge space between the electrodes 135*a*, 135*b* three times and the beam thereof is expanded.

The monitor module 40 includes beam splitters 142, 143, a spectrum monitor 146, and an optical sensor 148. The beam splitter 142 is arranged, on the optical path of pulse laser light PL3 output from the excimer amplifier 30, such that the pulse laser light PL3 reflected by the beam splitter 142 is incident on the beam splitter 143. Here, the beam splitter 142 may be arranged outside the monitor module 40.

The beam splitter 143 is arranged such that the pulse laser light PL3 reflected by the beam splitter 143 enters the spectrum monitor 146 and the pulse laser light PL3 transmitted through the beam splitter 143 enters the optical sensor 148.

The spectrum monitor 146 monitors the spectrum of the entering pulse laser light PL3 and detects the oscillation wavelength of the entering pulse laser light PL3. The spectrum monitor 146 may be, for example, an etalon spectrometer. The etalon spectrometer includes a diffusion plate for diffusing sample light, an etalon, a light concentrating lens arranged on the output side of the etalon, and a photodiode array arranged on the focal plane of the light concentrating lens for detecting the pattern of interference fringes, and can detect the wavelength by measuring the diameter of the interference fringes.

The optical sensor 148 detects the pulse energy of the entering pulse laser light PL3. The optical sensor 148 may be, for example, a photodiode or the like.

The outlet port shutter 46 is arranged on the optical path of the pulse laser light PL3 output from the laser device 10 to the outside, and is configured to be capable of switching between outputting, to the outside, and blocking of the pulse laser light PL3. The pulse laser light PL3 transmitted through the beam splitter 142 is output from the laser device 10 via the outlet port shutter 46.

The laser device 10 is connected to the exposure apparatus 80 via a beam delivery unit (BDU) (not shown). The BDU is an optical system that transmits the pulse laser light PL3 from the laser device 10 to the exposure apparatus 80. The pulse laser light PL3 output from the laser device 10 enters the exposure apparatus 80.

The exposure apparatus 80 includes an exposure control processor 86. The exposure control processor 86 controls the exposure apparatus 80. Further, the exposure control processor 86 is connected to the laser control processor 50. The exposure apparatus 80 is an example of the "external apparatus" in the present disclosure.

1.2 Operation

The exposure control processor 86 transmits various parameters including a target wavelength, a target spectral line width, and a target pulse energy to the laser control processor 50. Further, the exposure control processor 86 transmits a light emission trigger signal Tr to the laser control processor 50. The laser control processor 50 controls the laser device 10 based on the various parameters and the light emission trigger signal Tr received from the exposure control processor 86. The laser control processor 50 outputs trigger signals Tr1, Tr2 synchronized with the light emission trigger signal Tr. The trigger signal Tr1 is input to the switch 123 of the PPM 122, and the trigger signal Tr2 is input to the solid-state amplifier 106.

The operation of the solid-state seeder 20 is as follows. CW laser light having a wavelength of about 773.6 nm is output from the semiconductor laser system 100. The CW laser light is phase-modulated by the optical phase modulator 104, and the optical spectrum thereof is changed in shape. The CW laser light having the shape-changed optical spectrum is pulse-amplified when a pulse current is supplied to the SOA in the solid-state amplifier 106 at the timing of the trigger signal Tr2, and is further amplified by the solid-state amplifier 106 including the fiber amplifier connected downstream of the SOA, and the pulse laser light PL1 having the shape-changed optical spectrum is output.

The amplified pulse laser light PL1 enters the wavelength conversion system 108 and is wavelength-converted to fourth harmonic light having a wavelength of about 193.4 nm.

The variable range of the wavelength of the pulse laser light PL2 output from the solid-state seeder 20 is about 193.2 nm to 193.5 nm, which is an amplification wavelength band of the excimer amplifier 30.

The trigger signal Tr1 is input to the switch 123 of the PPM 122 so that discharge occurs in synchronization with the pulse laser light PL2 output from the solid-state seeder 20 entering the discharge space of the chamber 120 of the excimer amplifier 30. Consequently, the pulse laser light PL2 output from the solid-state seeder 20 is three-pass amplified by the excimer amplifier 30.

The pulse laser light PL3 amplified by the excimer amplifier 30 is sampled by the beam splitter 142 and the beam splitter 143 of the monitor module 40, and the optical spectrum and the pulse energy are measured by the spectrum monitor 146 and the optical sensor 148.

From the measured optical spectrum of the pulse laser light PL3 output from the excimer amplifier 30, the laser control processor 50 transmits a control signal of the center wavelength to the solid-state seeder control processor 112 so that the center wavelength approaches the target wavelength which is the target value. The solid-state seeder 112 transmits command values of the control processor 1 temperature value and the current value to the semiconductor laser system 100 based on the control signal acquired from the laser control processor 50. The semiconductor laser system 100 changes the temperature and the current of the semiconductor laser of the semiconductor laser system 100 based on the command values of the temperature value and the current value acquired from the solid-state seeder control processor 112 to change the oscillation wavelength.

Further, from the measured optical spectrum of the pulse laser light PL3 output from the excimer amplifier 30, the laser control processor 50 transmits a control signal of the spectral line width to the solid-state seeder control processor 112 so that the spectral line width approaches the target spectral line width which is the target value. The solid-state seeder control processor 112 changes the signal bandwidth and power of the modulation signal output from the white noise generator 110 based on the control signal acquired from the laser control processor 50.

The optical phase modulator 104 changes the optical spectrum of the laser light output from the optical phase modulator 104 according to the signal bandwidth and power of the output from the white noise generator 110.

Further, the laser control processor 50 changes the charge voltage of the charger 124 so that the measured pulse energy of the pulse laser light PL3 output from the excimer amplifier 30 approaches the target pulse energy which is the target value.

1.3 Problem

The optical spectrum of the semiconductor laser is very narrow, and the spectral line width required by the exposure apparatus 80 cannot be obtained even if wavelength conversion to deep ultraviolet (DUV) light is directly performed. Phase modulation of the output light of the semiconductor laser results in a band (spectral rise) due to modulation around the original spectrum. When the white noise is selected as the modulation signal, the phase-modulated optical spectrum may be a Gaussian-shaped spectrum corresponding to the signal bandwidth and the signal intensity of the white noise. By appropriately selecting the signal bandwidth and the signal intensity of the white noise, it is possible to set the optical spectral line width to the target width.

Figure 2:
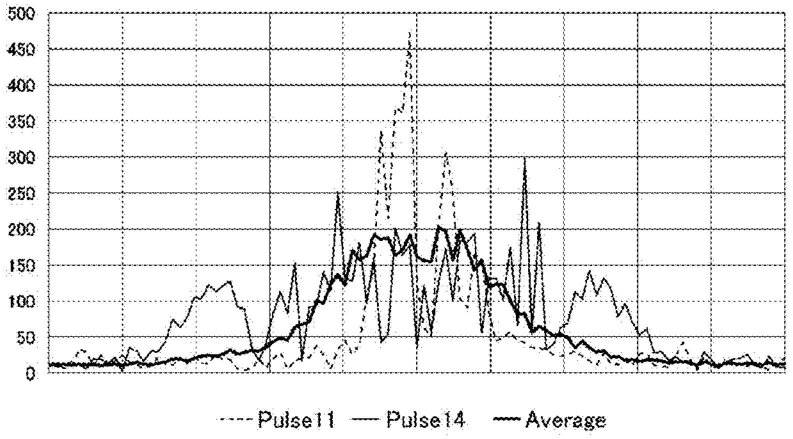
FIG. 2 is a graph showing an example of a white noise spectrum waveform superimposed at each timing of the 11th pulse and the 14th pulse of a plurality of pulses, and a white noise spectrum waveform averaged for 20 pulses.

However, in the case of pulse light, it is found that, in the white noise generator 110, the spectrum distribution of the signal to be superimposed on the optical phase modulator 104 in a very short period of time, such as corresponding to the pulse width (e.g., about 30 nsec), is not the ideal Gaussian distribution, but has a multimodal complicated shape and differs in shape from pulse to pulse (see FIG. 2). For this reason, the light spectrum pulsed after the phase modulation also becomes a complicated shape, and the optical spectral shape varies from pulse to pulse (see FIG. 3). Therefore, there is a problem that the spectral line width of each pulse is not stable.

FIG. 2 is a graph showing an example of a white noise spectrum waveform superimposed at each timing of the 11th pulse and the 14th pulse of the plurality of pulses, and a white noise spectrum waveform averaged for 20 pulses. As shown in FIG. 2, the averaged white noise spectrum waveform is similar to the Gaussian shape, but each white noise spectrum waveform has a complicated shape and varies greatly from pulse to pulse.

Figure 3:
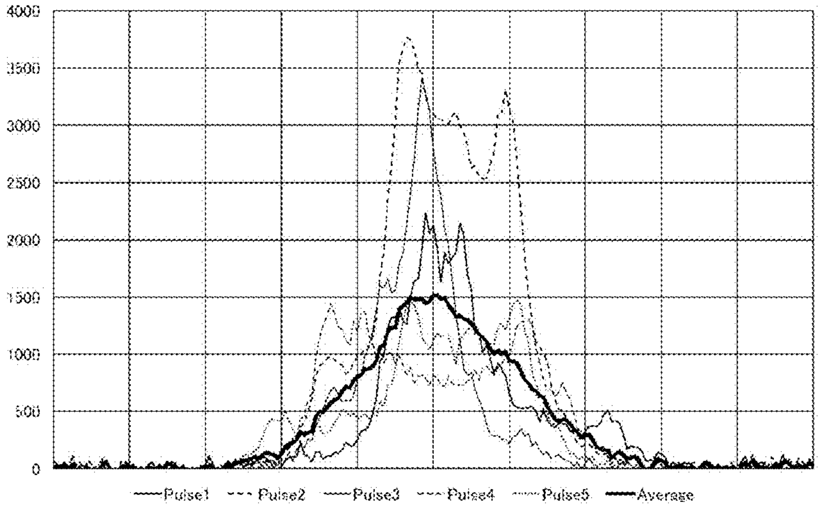
FIG. 3 is a graph showing an example of an optical spectrum waveform of each pulse from the first pulse to the fifth pulse and an optical spectrum waveform averaged for 26 pulses.

FIG. 3 is a graph showing an example of an optical spectrum waveform of each pulse from the first pulse to the fifth pulse and an optical spectrum waveform averaged for 26 pulses. As shown in FIG. 3, the optical spectrum waveform after the phase modulation has a complicated shape, and the optical spectrum waveform varies from pulse to pulse.

2. First Embodiment 2.1 Configuration

Figure 4:
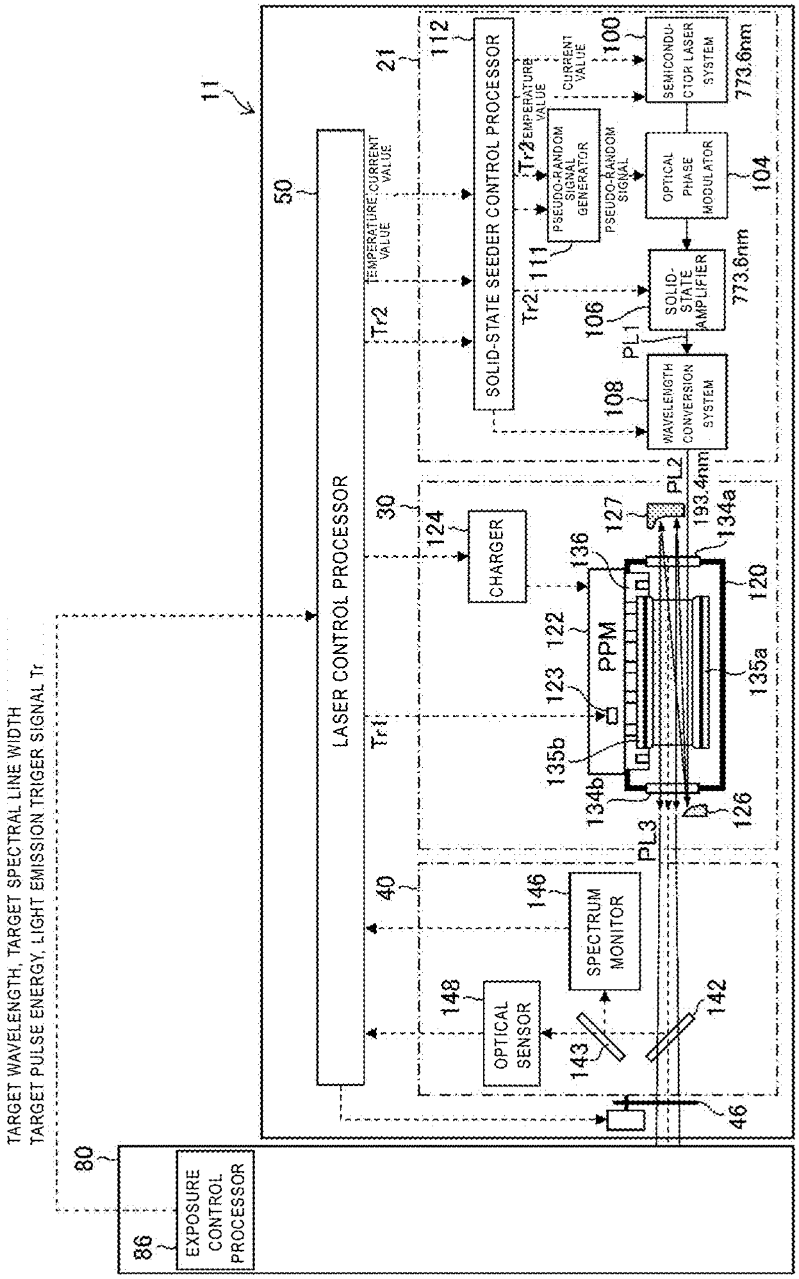
FIG. 4 schematically shows the configuration of a laser device according to a first embodiment.

FIG. 4 schematically shows the configuration of a laser device 11 according to a first embodiment. The configuration shown in FIG. 4 will be described in terms of differences from the configuration shown in FIG. 1.

The laser device 11 includes a solid-state seeder 21 instead of the solid-state seeder 20 of FIG. 1. The solid-state seeder 21 includes a pseudo-random signal generator 111 instead of the white noise generator 110. The pseudo-random signal generator 111 superimposes a modulation signal on the optical phase modulator 104. The pseudo-random signal generator 111 includes, for example, a multi-stage shift register and a digital filter. Other configurations may be similar to those in FIG. 1.

The pseudo-random signal generator 111 is an example of the "modulation signal 1 generator" in the present disclosure. The solid-state amplifier 106 is an example of the "first amplifier" in the present disclosure, and the pulse laser light PL1 output from the solid-state amplifier 106 is an example of the "first pulse laser light" in the present disclosure. The pulse laser light PL2 output from the wavelength conversion system 108 is an example of the "second pulse laser light" in the present disclosure. The wavelength in the wavelength range of about 193.2 nm to 193.5 nm is an example of the "ultraviolet wavelength" in the present disclosure. The excimer amplifier 30 is an example of the "second amplifier" in the present disclosure.

2.2 Operation

The CW laser light having a wavelength of about 773.6 nm is output from the semiconductor laser of the solid-state seeder 21. The solid-state seeder control processor 112 transmits a reset signal for the shift register in the pseudo-random signal generator 111 and a timing signal same as the trigger signal Tr2 to the pseudo-random signal generator 111.

The pseudo-random signal generator 111 receives a reset signal from the solid-state seeder control processor 112 for the shift register, and generates a pseudo-random signal having an identical pattern in synchronization with the trigger signal Tr2 due to the timing signal of the trigger signal Tr2. In the pseudo-random signal, unnecessary spectral components of a high frequency component are removed by a subsequent variable bandpass filter.

The optical phase modulator 104 phase-modulates the CW laser light with the pseudo-random signal limited to an appropriate frequency band from the pseudo-random signal generator 111 to change the shape of the optical spectrum.

The optical spectral line width becomes wider when the cutoff frequency of the variable bandpass filter is changed to the high frequency side, and becomes narrower when the cutoff frequency of the variable bandpass filter is changed to the low frequency side. Further, the waveform and spectral shape of the pseudo-random signal are changed by changing the timing of entering the reset signal to the shift register in the pseudo-random signal generator 111 and the like, and the optical spectrum of the laser light output from the optical phase modulator 104 is also changed.

For controlling the spectral line width, the frequency of the pseudo-random signal is adjusted based on the measured spectral line width. Specifically, the cutoff frequency of the variable bandpass filter is adjusted.

Figure 5:
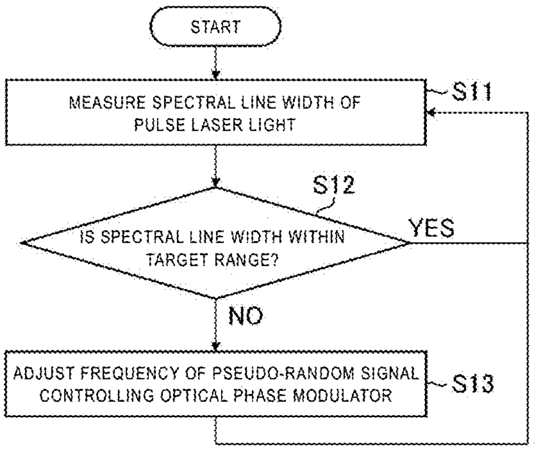
FIG. 5 is a flowchart showing a first control example of a spectral line width.

FIG. 5 is a flowchart showing a first control example of the spectral line width. In step S11, the laser control processor 50 measures the spectral line width of the pulse laser light PL3 using the spectrum monitor 146 of the monitor module 40. The spectrum monitor 146 is an example of the "measurement instrument" in the present disclosure. In step S12, the laser control processor 50 determines whether or not the measured spectral line width is within the target range.

When the determination result of step S12 is YES, the laser control processor 50 returns to step S11. When the determination result of step S12 is NO, the laser control processor 50 proceeds to step S13.

In step S13, the laser control processor 50 transmits a command to the solid-state seeder control processor 112 to adjust the frequency of the pseudo-random signal controlling the optical phase modulator 104 via the solid-state seeder control processor 112. After step S13, the laser control processor 50 returns to step S11.

Other operation may be the same as the operation of the laser device 10 according to the comparative example described with reference to FIG. 1. The laser control processor 50 and the solid-state seeder control processor 112 are examples of the "processor" in the present disclosure.

2.3 Specific Example of Pseudo-Random Signal Generator

Figure 6:
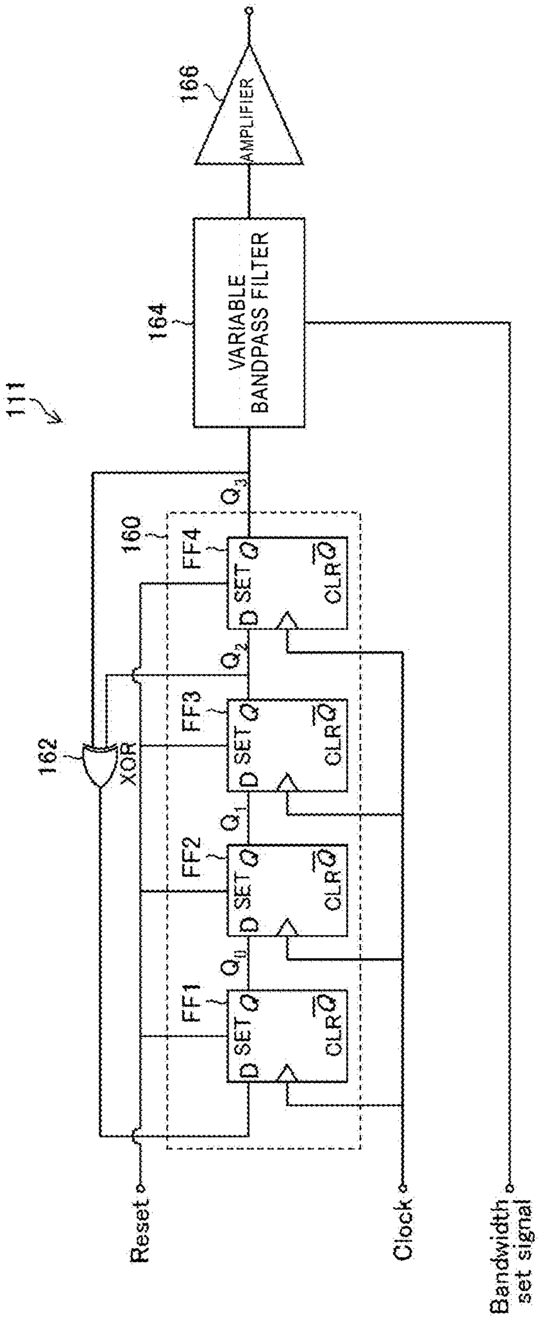
FIG. 6 shows an example of a pseudo-random signal generator using a shift register.

FIG. 6 shows an example of the pseudo-random signal generator 111 using a shift register 160. Here, the pseudo-random signal generator 111 simply using four D flip-flops FF1 to FF4 as an example of the shift register 160 is shown.

The pseudo-random signal generator 111 includes the D flip-flops FF1 to FF4, an exclusive OR (XOR) circuit 162, a variable bandpass filter 164, and an amplifier 166. As shown in FIG. 6, the four D flip-flops FF1 to FF4 are connected in series, Q2 output of the D flip-flop FF3 of the third stage and Q3 output of the D flip-flop FF4 of the fourth stage are input to the XOR circuit 162, and the output of the XOR circuit 162 is fed back to the D flip-flop FF1 of the first stage. The Q3 output of the D flip-flop FF4 of the fourth stage is input to the variable bandpass filter 164, and the output from the variable bandpass filter 164 is amplified and output by the amplifier 166. The passband of the variable bandpass filter 164 is controlled by a control signal from the solid-state seeder control processor 112.

FIG. 7 is a truth table of the pseudo-random signal generator 111 shown in FIG. 6. As shown in FIG. 7, the pseudo-random signal generator 111 repeats the identical random pattern (pseudo-random pattern) every 16 times of clock counting (cycle 15). The Q3 digital output is band-limited by the filter. An array of "0" or "1" in Q3 is a random pattern of binary codes.

Although FIGS. 6 and 7 show the pseudo-random pattern with the cycle of 15, the length of the pattern can be increased to $2^n-1$ by increasing the number of D flip-flops and the number of XOR circuits and feeding back from an appropriate position. Here, n is equal to the number of D flip-flops.

By increasing clock frequency, a pseudo-random signal having a higher frequency band can be generated.

2.4 Example of Time Chart

Figure 8:
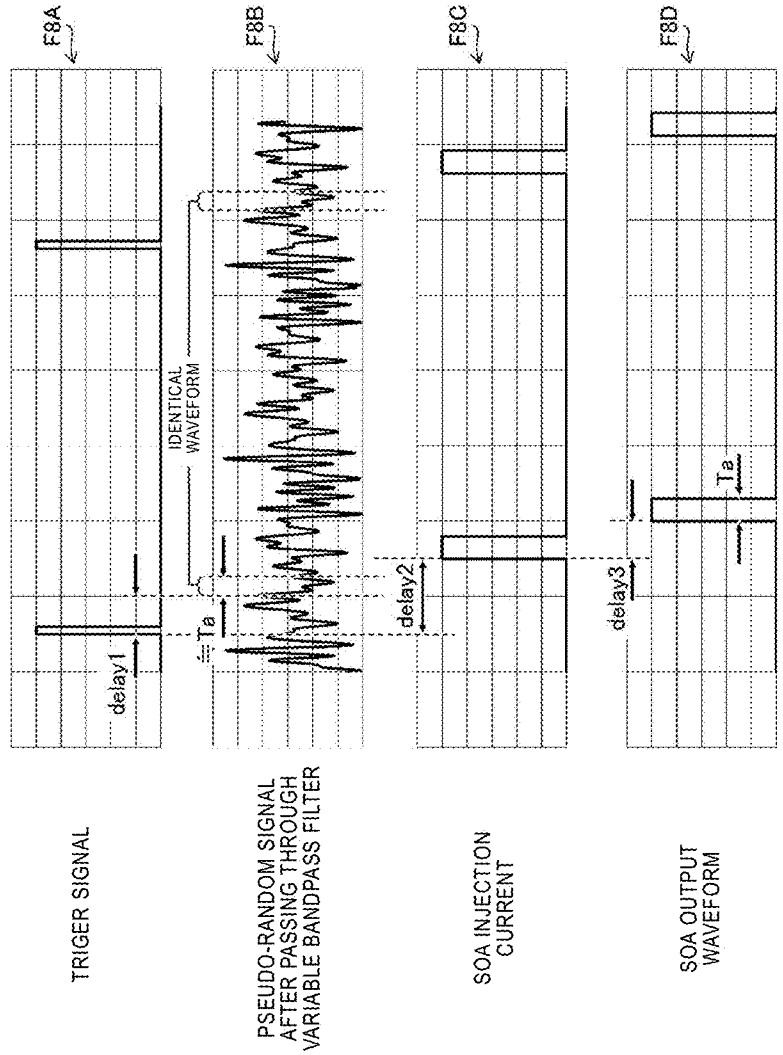
FIG. 8 shows an example of a time chart in a solid-state seeder of the first embodiment.

FIG. 8 shows an example of a time chart in the solid-state seeder 21 according to the first embodiment. F8A at the uppermost in FIG. 8 shows the state of the trigger signal Tr2. F8B at the second stage from the top in FIG. 8 shows the waveform of the t pseudo-random signal after passing through the variable bandpass filter 164. F8C at the third stage from the top in FIG. 8 shows the timing of SOA injection current. F8D at the lowermost in FIG. 8 shows the output waveform of the SOA.

Time Ta in FIG. 8 is the time when pulse amplification has been performed by increasing the SOA injection current. The time Ta may be a time corresponding to one pulse. A first delay time (delay1) with respect to the trigger signal Tr2 is adjusted so that the modulated light with the pseudo-random signal, which has the desired time waveform, matches the timing of the amplification due to increase of the SOA injection current.

The pulse current (injection current) is supplied to the SOA after a second delay time (delay2) from the timing of the trigger signal Tr2. Here, delay2 is the sum of the time of delay1 and the time until the SOA starts amplification after the phase-modulated laser light reaches the SOA.

Pulse light is output from the SOA after a third delay time (delay3) from the timing of starting to increase the SOA injection current. Here, delay3 is the period of delay for propagating in the SOA after continuous light entering the SOA is pulsed at the SOA.

As shown in FIG. 8, the pseudo-random signal generated in a predetermined period (approximately the period of the time Ta) after delay1 from the timing of the trigger signal Tr2 has a waveform of the identical pattern each time.

2.5 Effect

According to the first embodiment, since the pseudo-random signal having the identical pattern is generated in synchronization with the trigger signal Tr2 synchronized with the timing of generation of the pulse light and is superimposed on the optical phase modulator 104, the modulation signal having the identical waveform for each pulse is superimposed on the optical phase modulator 104, and the spectral shape of the superimposed signal is also the identical for each pulse. Therefore, since the optical spectrum of the laser light output from the optical phase modulator 104 is modulated identically for each pulse, the optical spectral shape is identical for each pulse, and the spectral line width is also identical for each pulse and stabilized.

2.6 Others

In FIG. 4, a part of the pulse laser light PL3 output from the excimer amplifier 30 is sampled to measure the spectral line width by the spectrum monitor 146, but measurement of the spectral line width is simply required to be performed for the pulse laser light after being pulse-amplified by the solid-state amplifier 106. For example, the spectral line width of the pulse laser light PL1 may be measured with a configuration in which a beam splitter is arranged on the optical path between the solid-state amplifier 106 and the wavelength conversion system 108, and a part of the pulse laser light PL1 output from the solid-state amplifier 106 is sampled and guided to a measurement instrument such as a spectrum monitor.

Further, for example, the spectral line width of the pulse laser light PL1 may be measured with a configuration in which a beam splitter is arranged on the optical path between the wavelength conversion system 108 and the excimer amplifier 30, and a part of the pulse laser light PL2 output from the wavelength conversion system 108 is sampled and guided to a measurement instrument such as a spectrum monitor.

That is, each of the pulse laser light PL1, PL2, PL3 propagating downstream of the solid-state amplifier 106 is an example of the "pulse laser light pulse-amplified by the first amplifier" in the present disclosure.

Further, in the first embodiment, the CW light from the semiconductor laser is converted to pulse laser light by causing a pulse current to flow through the SOA, but the method of generating the pulse laser light is not limited thereto. For example, the CW light from the semiconductor laser may be amplified into pulse laser light by exciting the excitation light of the titanium-sapphire crystal of the solid-state amplifier 106 with the pulse light.

Alternatively, instead of the SOA, an optical shutter may be used for optical pulsing. The optical shutter may be a combination of an electro optical (EO) pockels cell and a polarizer, or may be a Mach-Zehnder optical modulator using an EO effect.

3. Second Embodiment 3.1 Configuration

Figure 9:
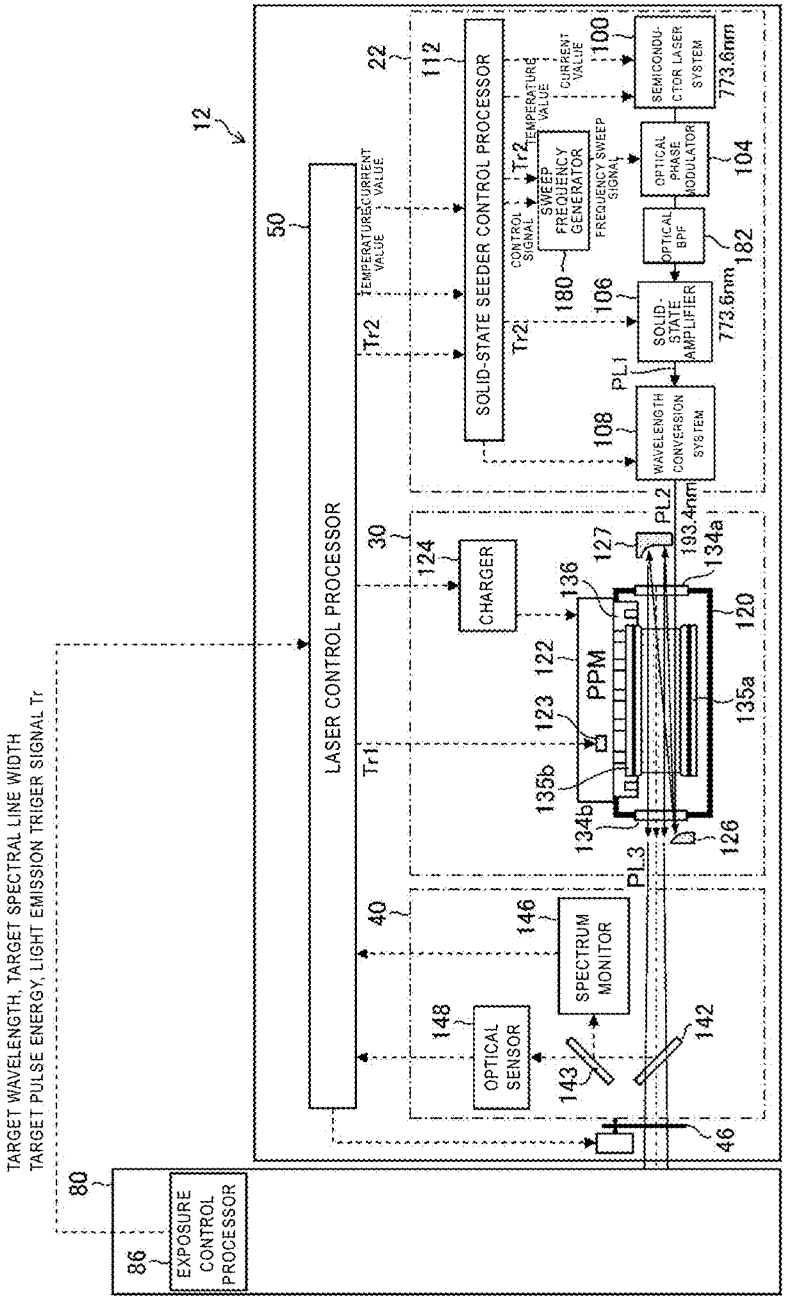
FIG. 9 schematically shows the configuration of the laser device according to a second embodiment.

FIG. 9 schematically shows the configuration of a laser device 12 according to a second embodiment. The configuration shown in FIG. 9 will be described in terms of differences from the configuration shown in FIG. 1. The laser device 12 shown in FIG. 9 includes a solid-state seeder 22 instead of the solid-state seeder 20 of FIG. 1. The solid-state seeder 22 includes a sweep frequency generator 180 instead of the white noise generator 110. The sweep frequency generator 180 superimposes the modulation signal on the optical phase modulator 104. The sweep frequency generator 180 includes, for example, a voltage control oscillator (VCO) whose oscillation frequency changes according to an applied voltage. The sweep frequency generator 180 is an example of the "modulation signal generator" in the present disclosure.

Further, in the solid-state seeder 22, an optical bandpass filter (BPF) 182 is arranged on the optical path between the optical phase modulator 104 and the solid-state amplifier 106. Other configurations may be similar to those in FIG. 1.

3.2 Operation

The CW laser light having a wavelength of about 773.6 nm is output from the semiconductor laser of the solid-state seeder 22. The solid-state seeder control processor 112 transmits the trigger signal Tr2 to the sweep frequency generator 180. The sweep frequency generator 180 sets a delay time of delay1 at the timing of the trigger signal Tr2, and then sweeps the frequency by changing the frequency at a substantially constant sweep speed (change in frequency per unit time) over a desired time, and outputs a frequency sweep signal.

The optical phase modulator 104 phase-modulates the CW laser light with the frequency sweep signal supplied from the sweep frequency generator 180 to change the optical spectral shape.

Figure 10:
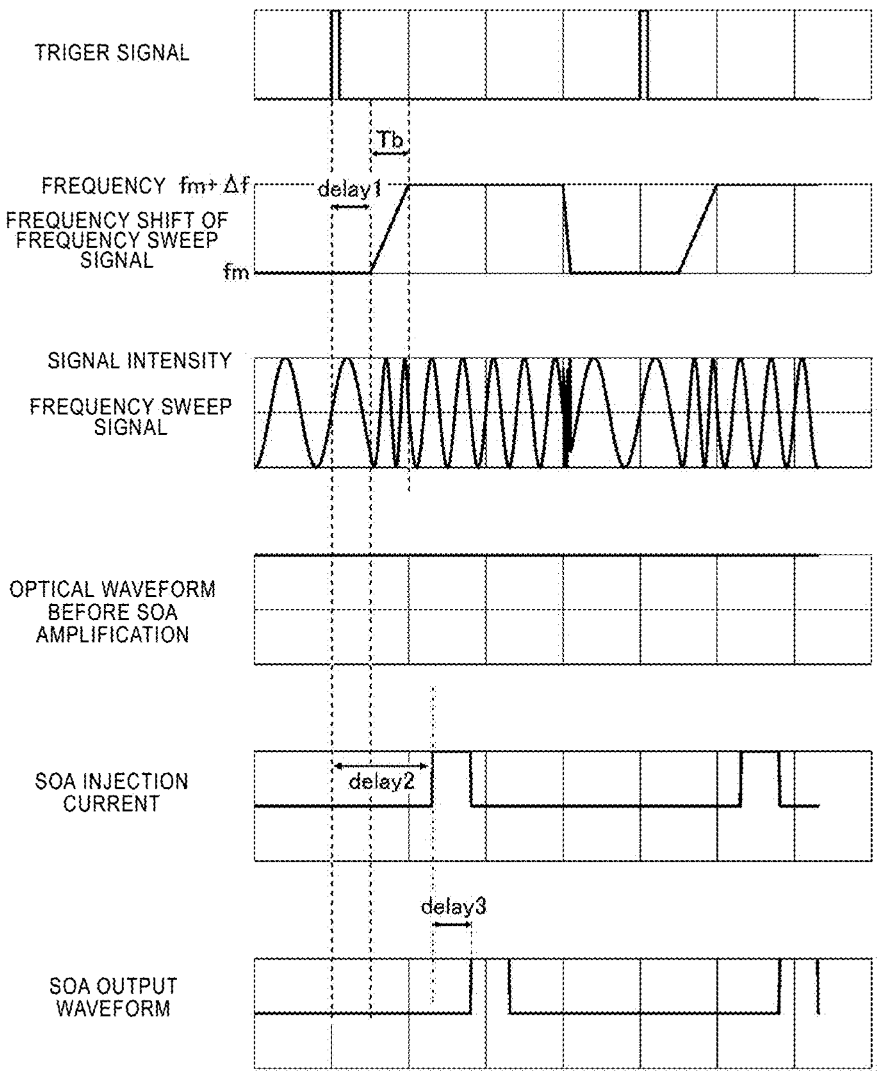
FIG. 10 is an example of a time chart in the solid-state seeder of the second embodiment.

FIG. 10 is an example of a time chart in the solid-state seeder 22 of the second embodiment. FIG. 10 shows charts of the trigger signal Tr2, the frequency shift of the frequency sweep signal, the frequency sweep signal, the optical waveform before amplification by the SOA (CW light), the SOA injection current, and the output waveform of the SOA in order from the top.

In the frequency shift chart of the frequency sweep signal shown at the second stage from the top, the vertical axis indicates the frequency as showing an example in which the base frequency is fm and the sweep width is Δf. That is, the frequency of the frequency sweep signal may vary from fm to fm+Δf. Note that the sweep width Δf satisfies Δf<fm. Although FIG. 10 shows an example in which the frequency is swept in the positive direction, the frequency sweep may be in the negative direction.

The frequency shift of the frequency sweep signal is started after the delay time of delay1 with respect to the timing of the trigger signal Tr2, and the frequency is changed at a constant rate during the period of time Tb. Here, delay1 is adjusted so that the light modulated with the frequency sweep signal of the time Tb is pulsed at the SOA in the solid-state amplifier 106. The time Tb is equal to or longer than the time Ta described with reference to FIG. 8, and is preferably approximately equal to the time Ta. Further, delay2 and delay3 shown in FIG. 10 are similar to those in FIG. 8.

3.3 Description of Change of Optical Spectral Shape

Figure 11:
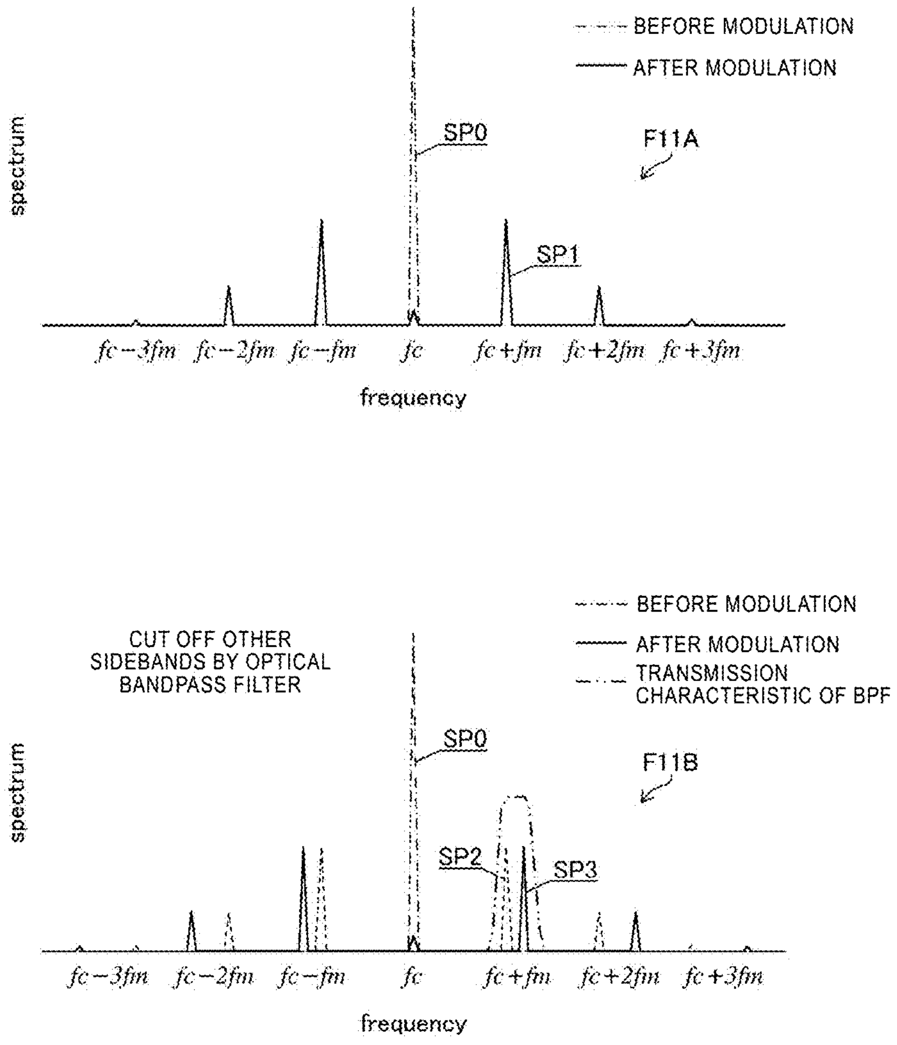
FIG. 11 is a graph showing an example of a spectral shape obtained when modulation is performed as applying a sine wave having a frequency fm to an optical phase modulator.

The change of the optical spectral shape will be described with reference to FIG. 11. FIG. 11 shows the spectral shape obtained when modulation is performed as applying a sine wave having the frequency fm to the optical phase modulator 104. At this time, sidebands in the distance fm are generated around the carrier frequency fc (see F11A). In F11A shown at the upper stage of FIG. 11, an optical spectrum SP0 indicated by a dashed-dotted line shows a spectrum without modulation (before modulation). An optical spectrum SP1 indicated by a solid line shows a spectrum obtained when modulation is performed as applying a sine wave having the frequency fm.

The solid-state seeder control processor 112 sweeps the modulation frequency fm to change the spectral line width (see F11B). F11B shown at the lower stage of FIG. 11 shows a state in which sweeping is performed from the optical spectrum SP2 indicated by broken lines toward the optical spectrum SP3 indicated by solid lines on the high frequency side, but sweeping can be performed toward the low frequency side.

The solid-state seeder 22 uses only the +1st order sideband of the frequency fc+fm shown in F11B, and cuts off other spectral components (in the example of FIG. 11, components fc−3fm, fc−2fm, fc−fm, fc, fc+2fm, and fc+3fm). In this way, in order to cut off unnecessary spectral components, the optical bandpass filter 182 is arranged in the solid-state seeder 22 in the subsequent stage of the output of the optical phase modulator 104. In F11B, an example of a transmission characteristic of the optical bandpass filter 182 is indicated by a two-dot chain line. Thus, only the spectral component of the light selected by the optical bandpass filter 182, for example, the component of fc+fm (+1st order sideband) is input to the solid-state amplifier 106.

Figure 12:
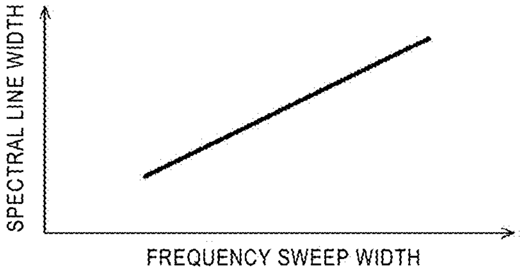
FIG. 12 is a graph showing the relationship between a frequency sweep width and the spectral line width.

FIG. 12 is a graph showing the relationship between the frequency sweep width and the spectral line width. The optical spectral line width is changed as being widened with increase of the sweep width of the modulation frequency fm and being narrowed with decrease of the sweep width. As shown in FIG. 12, the sweep width of the modulation frequency fm and the spectral line width generally have linear relationship.

For controlling the spectral line width, the sweep width of the modulation frequency fm is adjusted so that the target spectral line width is obtained based on the spectral line width measured by the monitor module.

Figure 13:
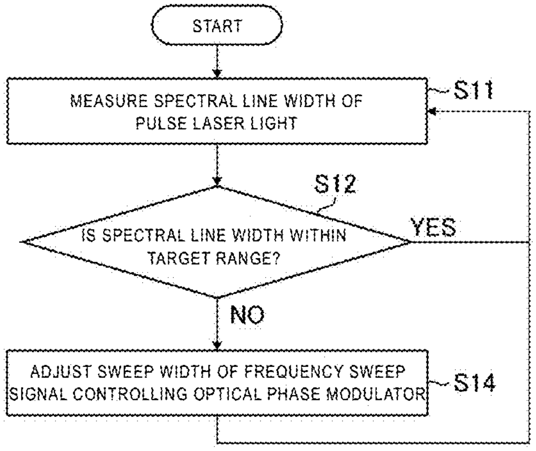
FIG. 13 is a flowchart showing a second control example of the spectral line width.

FIG. 13 is a flowchart showing a second control example of the spectral line width. The flowchart shown in FIG. 13 will be described in terms of differences from that shown in FIG. 5. The flowchart shown in FIG. 13 includes step S14 instead of step S13 of FIG. 5. That is, when the determination result of step S12 is NO, the laser control processor 50 proceeds to step S14.

In step S14, the laser control processor 50 transmits a command to the solid-state seeder control processor 112 to adjust the sweep width of the frequency sweep signal controlling the optical phase modulator 104 via the solid-state seeder control processor 112. After step S14, the laser control processor 50 returns to step S11. Other steps may be similar to those in FIG. 5.

3.4 Effect

According to the second embodiment, since the waveform of the modulation signal input to the optical phase modulator 104 is synchronized with the trigger signal Tr2, the pulse laser light is modulated with the identical waveform. According to the above, the optical spectral shape is identical for each pulse, and the spectral line width is also identical for each pulse.

In order to facilitate the control of the spectral line width, as shown in FIG. 12, the relationship between the sweep width of the modulation frequency fm and the spectral line width is preferably linear. By sweeping the frequency at a constant sweep speed, an optical spectrum waveform close to a rectangular shape is obtained. Further, by changing the sweep speed, optical spectrum having various shapes can be obtained.

4. First Modification of Solid-State Seeder

4.1 Configuration

Figure 14:
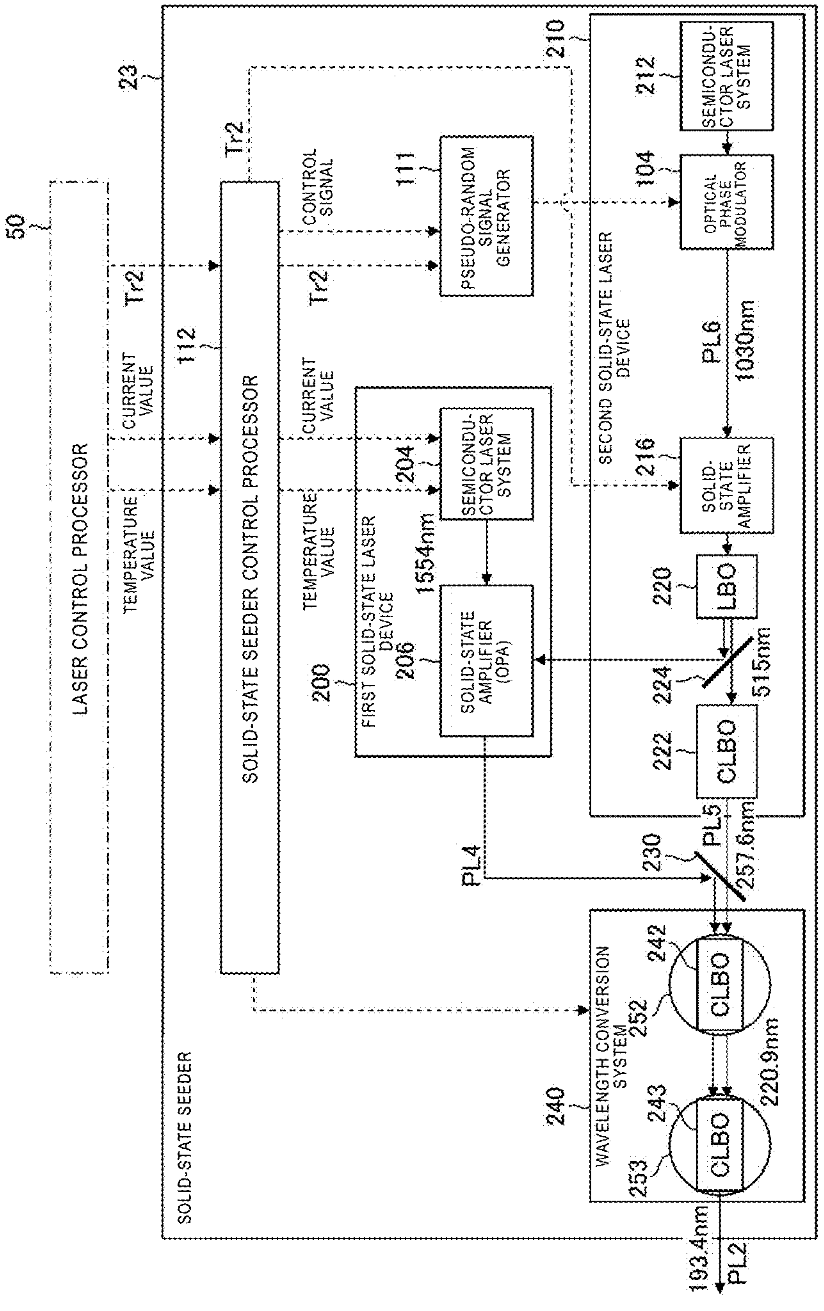
FIG. 14 schematically shows the configuration of the solid-state seeder according to a first modification.

Modification of the solid-state seeder 21 described with reference to FIG. 4 will be described. FIG. 14 schematically shows the configuration of a solid-state seeder 23 according to a first modification. The solid-state seeder 23 shown in FIG. 14 can be applied instead of the solid-state seeder 21 of FIG. 4. The solid-state seeder 23 may have a configuration in which two seed lights are input to a wavelength conversion system 240.

The solid-state seeder 23 includes a first solid-state laser device 200, a second solid-state laser device 210, a dichroic mirror 230, the wavelength conversion system 240, the solid-state seeder control processor 112, and the pseudo-random signal generator 111.

The solid-state seeder 23 has a system configuration in which pulse laser light PL4 having a wavelength of about 1554 nm output from the first solid-state laser device 200 and pulse laser light PL5 having a wavelength of about 257.6 nm output from the second solid-state laser device 210 are converted to the pulse laser light PL2 having a wavelength of about 193.4 nm by two times of sum frequency in the wavelength conversion system 240.

The first solid-state laser device 200 includes a semiconductor laser system 204 and a solid-state amplifier 206. The semiconductor laser system 204 may have a configuration similar to that of the semiconductor laser system 100 shown in FIG. 4, and has an oscillation wavelength different from that of the semiconductor laser system 100. The semiconductor laser system 204 includes a semiconductor laser that performs CW oscillation in a single longitudinal mode at a wavelength of about 1554 nm.

The solid-state amplifier 206 may be an optical parametric amplifier (OPA). The OPA is, for example, a periodically poled lithium niobate (PPLN) crystal or a periodically poled potassium titanyl phosphate (PPKTP) crystal.

The solid-state amplifier 206 is configured to pulse-amplify the seed light by receiving pulse laser light having a wavelength of 1030 nm to be described later as pumping light and laser light output from the semiconductor laser system 204 as seed light.

The second solid-state laser device 210 includes a semiconductor laser system 212, the optical phase modulator 104, a solid-state amplifier 216, an LBO crystal 220 and a CLBO crystal 222, which are two nonlinear crystals for performing second harmonic generation twice and wavelength-converting such that the optical frequency becomes four times, and a dichroic mirror 224. “CLBO” is represented by the chemical formula $CsLiB_6O_{10}$.

The semiconductor laser system 212 may have a configuration similar to that of the semiconductor laser system 100 shown in FIG. 2, and has an oscillation wavelength different from that of the semiconductor laser system 100. The semiconductor laser system 212 includes a semiconductor laser that performs CW oscillation in a single longitudinal mode at a wavelength of about 1030 nm.

The solid-state amplifier 216 may be configured to include, for example, a Yb fiber amplifier or a Yb:YAG crystal. The solid-state 216 may amplifier have a configuration similar to that of the solid-state amplifier 106. The optical phase modulator 104 is arranged on the optical path between the semiconductor laser system 212 and the solid-state amplifier 216. The solid-state amplifier 216 is an example of the "first amplifier" in the present disclosure.

The dichroic mirror 224 is arranged on the optical path between the LBO crystal 220 and the CLBO crystal 222, and highly transmits pulse laser light having a wavelength of about 515 nm and highly reflects pulse laser light having a wavelength of about 1030 nm. The dichroic mirror 224 is arranged such that the highly reflected pulse laser light having a wavelength of about 1030 nm is incident thereon as the pumping light of the solid-state amplifier 206. Instead of the dichroic mirror 224, a beam splitter (not shown) may be arranged between the LBO crystal 220 and the solid-state amplifier 216, and the pulse laser light output from the solid-state amplifier 216 may be branched so as to enter the LBO crystal 220 and the solid-state amplifier 206, respectively.

The wavelength conversion system 240 includes a CLBO crystal 242 and a CLBO crystal 243, and a rotation stage 252 and a rotation stage 253. The CLBO crystal 242 and the CLBO crystal 243 are arranged on the rotation stage 252 and the rotation stage 253 including piezoelectric elements, respectively, and are configured so that the incident angles on the respective crystals can be changed at high speed.

The dichroic mirror 230 is configured to highly reflect the pulse laser light PL4 having a wavelength of about 1554 nm output from the first solid-state laser device 200 and to highly transmit the pulse laser light PL5 having a wavelength of about 257.6 nm output from the second solid-state laser device 210, and is arranged so that both pulse laser lights coaxially enter the wavelength conversion system 240.

4.2 Operation

In the solid-state seeder 23, the wavelength of the pulse laser light PL4 output from the first solid-state laser device 200 is changed from pulse to pulse while the wavelength of the pulse laser light PL5 output from the second solid-state laser device 210 is fixed, whereby the wavelength of the pulse laser light PL2 output from the wavelength conversion system 240 can be changed.

The operation of the second solid-state laser device 210 is as follows. The solid-state seeder control processor 112 fixes the oscillation wavelength of the second solid-state laser device 210 to 1030 nm. That is, the solid-state seeder control processor 112 causes the semiconductor laser to continuously oscillate with the current value of the semiconductor laser in the semiconductor laser system 212 kept constant, and the semiconductor laser to output CW laser light.

The CW laser light output from the semiconductor laser system 212 is phase-modulated by the optical phase modulator 104 and enters the solid-state amplifier 216. The operation of the pseudo-random signal generator 111 and the optical phase modulator 104 are the same as those of the first embodiment described with reference to FIG. 4.

The solid-state seeder control processor 112 causes the solid-state amplifier 216 to pulse-amplify the CW laser light in synchronization with the trigger signal Tr2. The solid-state amplifier 216 outputs pulse laser light PL6 having a wavelength of 1030 nm.

The pulse laser light PL6 having a wavelength of 1030 nm output from the solid-state amplifier 216 is converted to the second harmonic light having a wavelength of 515 nm in the LBO crystal 220. The second harmonic light having a wavelength of about 515 nm is highly transmitted through the dichroic mirror 224, and is converted by the CLBO crystal 222 to the pulse laser light PL5 having a wavelength of about 257.6 nm.

Here, the dichroic mirror 224 highly reflects the pulse laser light having a wavelength of 1030 nm that has not been wavelength-converted by the LBO crystal 220, and causes the pulse laser light to enter as the pumping light of the solid-state amplifier 206 of the first solid-state laser device 200.

On the other hand, the laser control processor 50 and the solid-state seeder control processor 112 can change the wavelength of the pulse laser light PL4 output from the first solid-state laser device 200 in the vicinity of 1554 nm by controlling the temperature value and/or the current value of the semiconductor laser in the semiconductor laser system 204 of the first solid-state laser device 200. The solid-state seeder control processor 112 may change the oscillation wavelength of the semiconductor laser system 204 from pulse to pulse.

The pulse laser light PL4 having a wavelength of about 1554 nm output from the first solid-state laser device 200 and the pulse laser light PL5 having a wavelength of 257.6 nm output from the CLBO crystal 222 are sum-frequency-mixed by the CLBO crystal 242 of the wavelength conversion system 240 and wavelength-converted to pulse laser light having a wavelength of about 220.9 nm. Further, by the CLBO crystal 243, the pulse laser light having a wavelength of about 220.9 nm and the pulse laser light having a wavelength of 1554 nm are sum-frequency-mixed and wavelength-converted to the pulse laser light PL2 having a wavelength of about 193.4 nm. Then, the pulse laser light PL2 is output from the wavelength conversion system 240.

4.3 Others

In FIG. 14, the optical phase modulator 104 is arranged in the second solid-state laser device 210, but the optical phase modulator 104 may be arranged on the optical path of the CW laser light from the semiconductor laser system 204 in the first solid-state laser device 200. That is, the optical phase modulator 104 may be arranged on the optical path between the semiconductor laser system 204 and the solid-state amplifier 206.

5. Second Modification of Solid-State Seeder 5.1 Configuration

Figure 15:
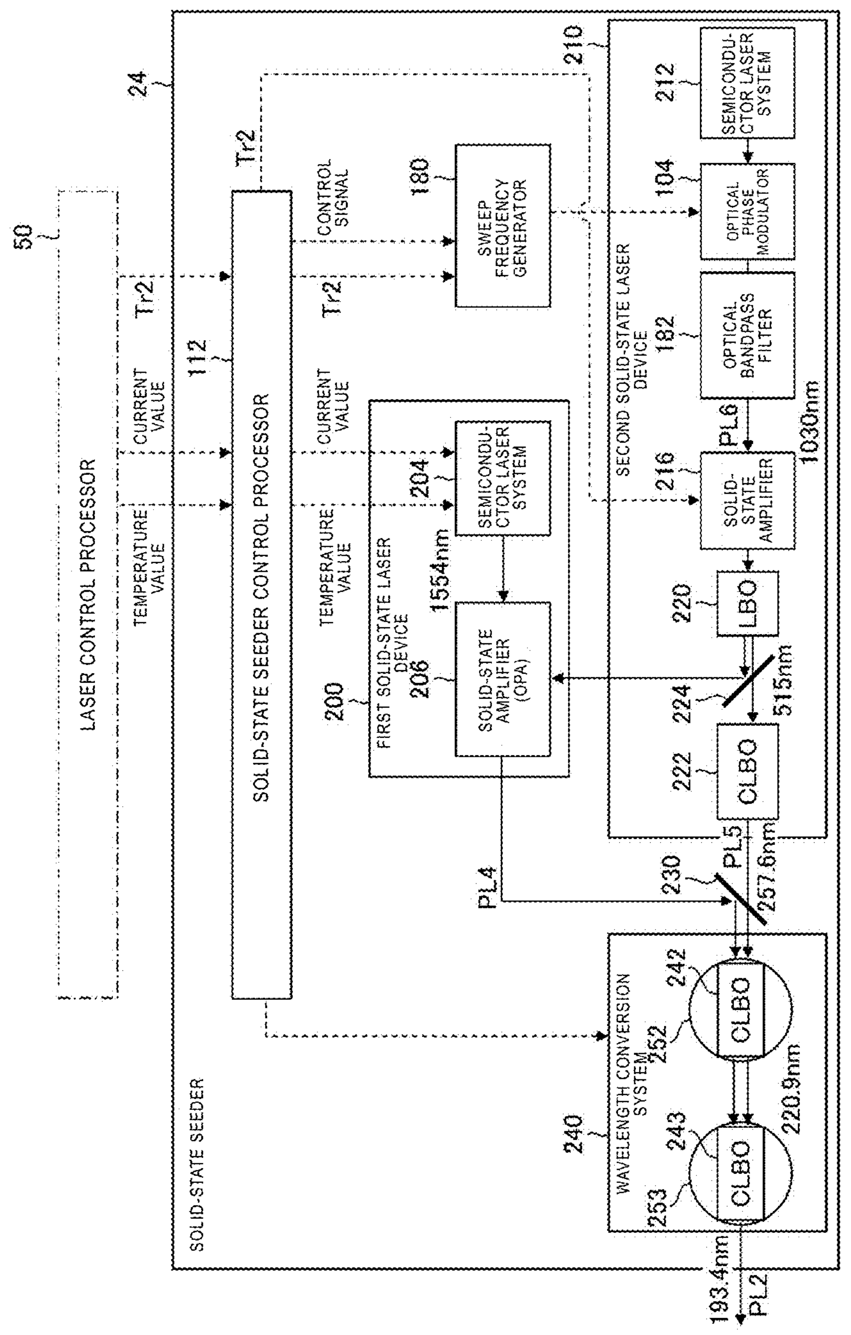
FIG. 15 schematically shows the configuration of the solid-state seeder according to a second modification.

Modification of the solid-state seeder 22 described with reference to FIG. 9 will be described. FIG. 15 schematically shows the configuration of a solid-state seeder 24 according to a second modification. The solid-state seeder 24 shown in FIG. 15 can be applied instead of the solid-state seeder 22 of FIG. 9. The configuration shown in FIG. 15 will be described in terms of differences from the configuration shown in FIG. 14. The solid-state seeder 24 includes the sweep frequency generator 180 instead of the pseudo-random signal generator 111 in FIG. 14, and includes the optical bandpass filter 182 on the optical path between the optical phase modulator 104 and the solid-state amplifier 216. Other configurations may be similar to those in FIG. 14.

5.2 Operation

The operation of the sweep frequency generator 180, the optical phase modulator 104, and the optical bandpass filter 182 shown in FIG. 15 are the same as those of the second embodiment described with reference to FIG. 9.

The CW laser light output from the semiconductor laser system 212 has a desired optical spectral shape due to the optical phase modulator 104 to which the frequency sweep signal output from the sweep frequency generator 180 is applied and the optical bandpass filter 182, and has the identical optical spectral shape for each pulse. Other operation is similar to that in the first embodiment described with reference to FIG. 4. Also for the solid-state seeder 24 shown in FIG. 15, the optical phase modulator 104 may be arranged on the optical path of the CW laser light of the semiconductor laser system 204 in the first solid-state laser device 200.

6. Other Modifications

The semiconductor laser used in the semiconductor laser system is not limited to a DFB laser, and may be a distributed Bragg reflector (DBR) type semiconductor laser or a sampled grating distributed Bragg reflector (SG-DBR) type semiconductor laser.

The first and second embodiments show an example of a three-multipass amplifier as the excimer amplifier, but not limited to a multipass amplifier, an amplifier including, for example, an optical resonator such as a Fabry-Perot resonator or a ring resonator may be adopted.

The first and second embodiments show an exemplary configuration in which a solid-state seeder and an ArF excimer amplifier are combined, but not limited to these embodiments, a combination of an excimer amplifier including a KrF laser gas and a solid-state seeder that oscillates in an amplification wavelength band of a KrF excimer may be adopted. Specifically, the solid-state seeder may be a semiconductor laser system that outputs pulse laser light having a wavelength of about 745.2 nm, a solid-state amplifier, and a wavelength conversion system that converts the wavelength to third harmonic light having a wavelength of about 248.4 nm. The wavelength conversion element in this case may be an LBO crystal that performs wavelength conversion to the second harmonic light and a CLBO crystal that performs sum-frequency-mixing of the second harmonic light and the fundamental wave.

7. Electronic Device Manufacturing Method

Figure 16:
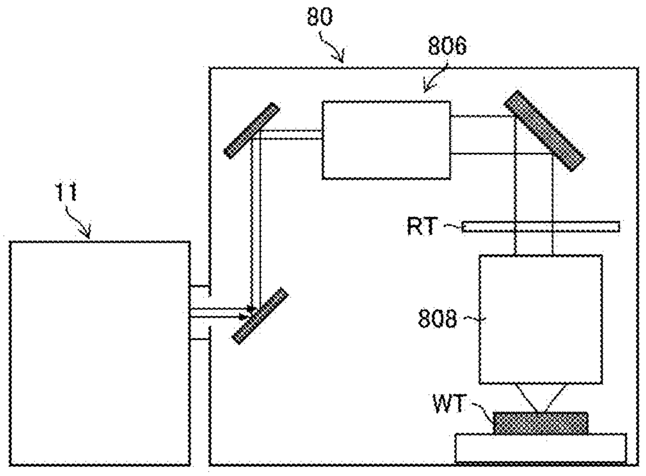
FIG. 16 schematically shows the configuration of an exposure apparatus.

FIG. 16 schematically shows a configuration example of the exposure apparatus 80. The exposure apparatus 80 includes an illumination optical system 806 and a projection optical system 808. The laser device 11 generates laser light and outputs the laser light to the exposure apparatus 80. The illumination optical system 806 illuminates a reticle pattern of a reticle (not shown) arranged on a reticle stage RT with laser light incident from the laser device 11. The projection optical system 808 causes the laser light transmitted through the reticle to be imaged as being reduced and projected on a workpiece (not shown) arranged on a workpiece table WT. The workpiece is a photosensitive substrate such as a semiconductor wafer on which photoresist is applied.

The exposure apparatus 80 synchronously translates the reticle stage RT and the workpiece table WT to expose the workpiece to the laser light reflecting the reticle pattern. After the reticle transferred pattern is onto the semiconductor wafer by the exposure process described above, a semiconductor device can be manufactured through a plurality of processes. The semiconductor device is an example of the "electronic device" in the present disclosure. Instead of the laser device 11, the laser device 12 may be applied.

8. Third Embodiment

8.1 Configuration

The configuration of the laser device according to a third embodiment may be similar to the configuration shown in FIG. 4. The laser device according to the third embodiment differs from the laser device 11 according to the first embodiment in the content of the control performed by the laser control processor 50.

8.2 Operation

The operation of the laser device according to the third embodiment will be described in terms of differences from the operation of the laser device 11 according to the first embodiment. In the laser device 11 according to the first embodiment, the spectral line width of the pulse laser light PL3 is controlled by adjusting the frequency of the pseudo-random signal s the modulation signal for controlling the optical phase modulator 104, whereas in the laser device according to the third embodiment, the spectral line width of the pulse laser light PL3 is controlled by adjusting the power of the modulation signal having an identical pattern in synchronization with the light emission trigger signal Tr.

Figure 17:
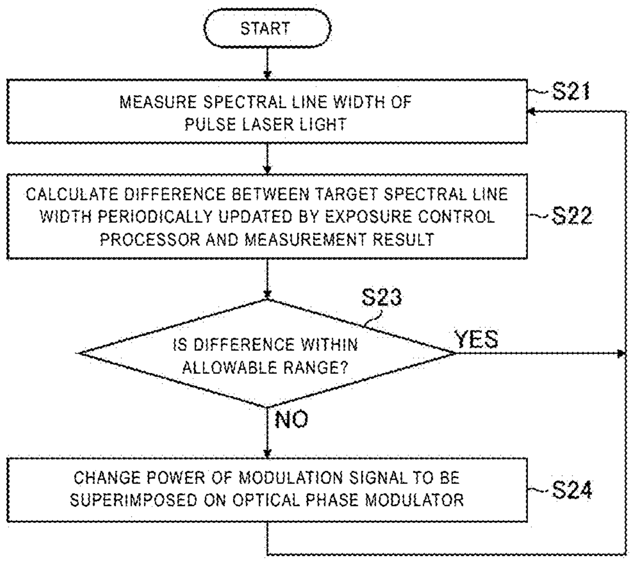
FIG. 17 is a flowchart showing a control example of the spectral line width in a third embodiment.

FIG. 17 is a flowchart showing a control example of the spectral line width in the third embodiment. Instead of the flowchart shown in FIG. 5, the flowchart shown in FIG. 17 is applied. In step S21 of FIG. 17, the laser control processor 50 measures the spectral line width of the pulse laser light PL3, which is the power of the excimer amplifier 30, using the spectrum monitor 146 of the monitor module 40.

In step S22, the laser control processor 50 calculates a difference between the target spectral line width periodically updated by the exposure control processor 86 and the measurement result (measured spectral line width) in step S21.

In step S23, the laser control processor 50 determines whether or not the difference calculated in step S22 is within an allowable range. When the determination result of step S23 is YES, that is, when the difference is within the allowable range, the laser control processor 50 returns to step S21.

On the other hand, when the determination result of step S23 is NO, that is, when the difference is outside the allowable range, the laser control processor 50 proceeds to step S24.

In step S24, the laser control processor 50 determines the power of the modulation signal based on a predetermined function indicating the relationship between the square root of the power of the modulation signal and the spectral line width and the difference calculated in step S22, and changes the power of the modulation signal to be superimposed on the optical phase modulator 104. When the spectral line width measured in step S21 (measurement result of step S21) is smaller than the target range, the laser control processor 50 increases the power of the modulation signal. On the other hand, when the spectral line width measured in step S21 is larger than the target range, the laser control processor 50 reduces the power of the modulation signal. Here, instead of the predetermined function indicating the relationship between the square root of the power of the modulation signal and the spectral line width, table data indicating the relationship between the square root of the power of the modulation signal recorded in advance and the spectral line width may be used. The operation of step S24 may be performed by the solid-state seeder control processor 112 in accordance with the command of the laser control processor 50.

After step S24, the laser control processor 50 returns to step S21. Other operation may be similar to the operation of the laser device 11 of the first embodiment.

Figure 18:
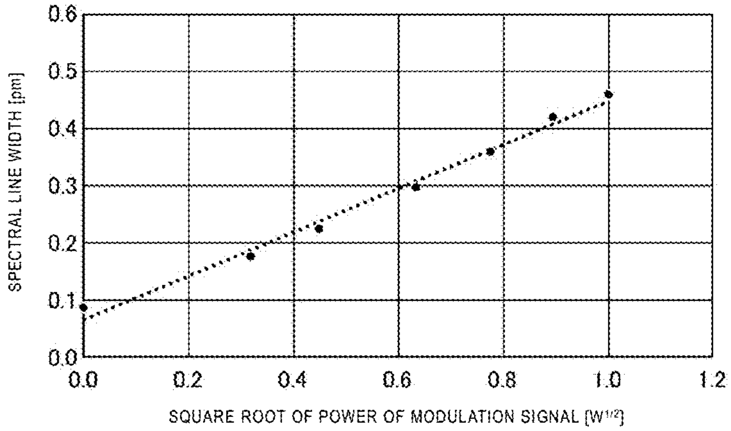
FIG. 18 is a graph showing the relationship between a square root of power of a modulation signal and the spectral line width.

FIG. 18 is a graph showing the relationship between the square root of the power of the modulation signal and the spectral line width. The black dots shown in FIG. 18 are plots of measurement results obtained by an experiment, and the straight line indicated by a broken line is an approximate straight line derived from the plots. As shown in FIG. 18, the square root of the power of the modulation signal and the spectral line width have a generally linear relationship. By storing the function or table data defining the relationship represented by the broken line in a memory of the laser control processor 50 or the solid-state seeder control processor 112, the laser control processor 50 or the solid-state seeder control processor 112 can execute the process of step S24.

8.3 Effect

According to the laser device of the third embodiment, since the relationship between the square root of the power of the modulation signal and the spectral line width of the pulse laser light PL3 has high linearity (see FIG. 18), the control of the spectral line width can be performed more easily and with high accuracy.

9. Fourth Embodiment 9.1 Configuration

Figure 19:
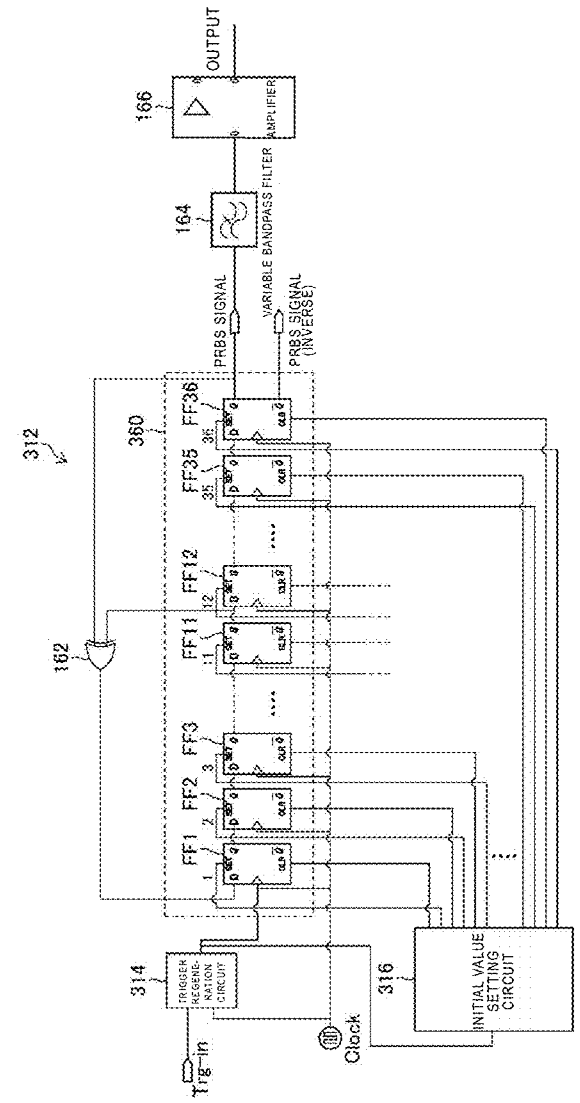
FIG. 19 shows an example of the pseudo-random signal generator applied to the laser device according to a fourth embodiment.

FIG. 19 is a configuration diagram showing an example of a pseudo-random signal generator 312 applied to the laser device according to a fourth embodiment. The laser device according to the fourth embodiment includes the pseudo-random signal generator 312 shown in FIG. 19 instead of the pseudo-random signal generator 111 described with reference to FIG. 6. Other configurations are similar to those of the laser device 11 according to the first embodiment.

In the pseudo-random signal generator 312, a trigger regeneration circuit 314 and an initial value setting circuit 316 are added, and an initial value of a shift register 360 is adjusted so that the shape (spectral shape) of the spectral waveform of the generated pulse laser light PL3 is unimodal.

The pseudo-random signal generator 312 includes D flip-flops FF1 to FF36, at least one exclusive OR (XOR) circuit 162, the variable bandpass filter 164, and the amplifier 166. As shown in FIG. 19, the thirty-six D flip-flops FF1 to FF36 are connected in series, Q output of the D flip-flop FF11 of the eleventh stage and Q output of the D flip-flop FF36 of the thirty-sixth stage are input to the XOR circuit 162, and the output of the XOR circuit 162 is fed back to the D flip-flop FF1 of the first stage. The Q output of the D flip-flop FF36 of the thirty-sixth stage is input to the variable bandpass filter 164, and the output from the variable bandpass filter 164 is amplified and output by the amplifier 166. The passband of the variable bandpass filter 164 and the output power of the amplifier 166 are controlled by a control signal from the solid-state seeder control processor 112.

The trigger regeneration circuit 314 generates a timing signal that changes initial values of the D flip-flops FF1 to FF36 based on the trigger signal Tr2 from the solid-state seeder control processor 112 and the clock of the pseudo-random signal generator 312.

The initial value setting circuit 316 transmits, in synchronization with the timing signal generated by the trigger regeneration circuit 314, a signal to a SET terminal or a CLR terminal of each of the D flip-flops FF1 to FF36 so that the initial value of each of the D flip-flops FF1 to FF36 is set to "0" or "1" ("Low" or "Hi") by the control signal from the solid-state seeder control processor 112. For example, the signal is transmitted to the CLR terminal to set the initial value to "0", and the signal is transmitted to the SET terminal to set the initial value to "1".

Although FIG. 19 shows an example in which thirty-six stages of D flip-flops are used, the number of stages of the D flip-flops is not limited to this example, and the number of stages, the feedback position, and the number of the XOR circuits may be appropriately set and connected according to a well-known feedback polynomial, for example. Further, the shift register 360 configured by multiple stages of the D flip-flops may be configured by a field programmable gate array (FPGA) and the like. Here, although the power of the modulation signal to be output is adjusted by the amplifier 166, the output power may be adjusted by inserting a variable attenuator in the subsequent stage or the preceding stage of the amplifier 166. Further, an XNOR circuit may be used instead of the XOR circuit 162. The pseudo-random signal generator 312 is an example of the "modulation signal generator" in the present disclosure. The amplifier 166 is an example of the "third amplifier" in the present disclosure.

9.2 Operation

Figure 20:
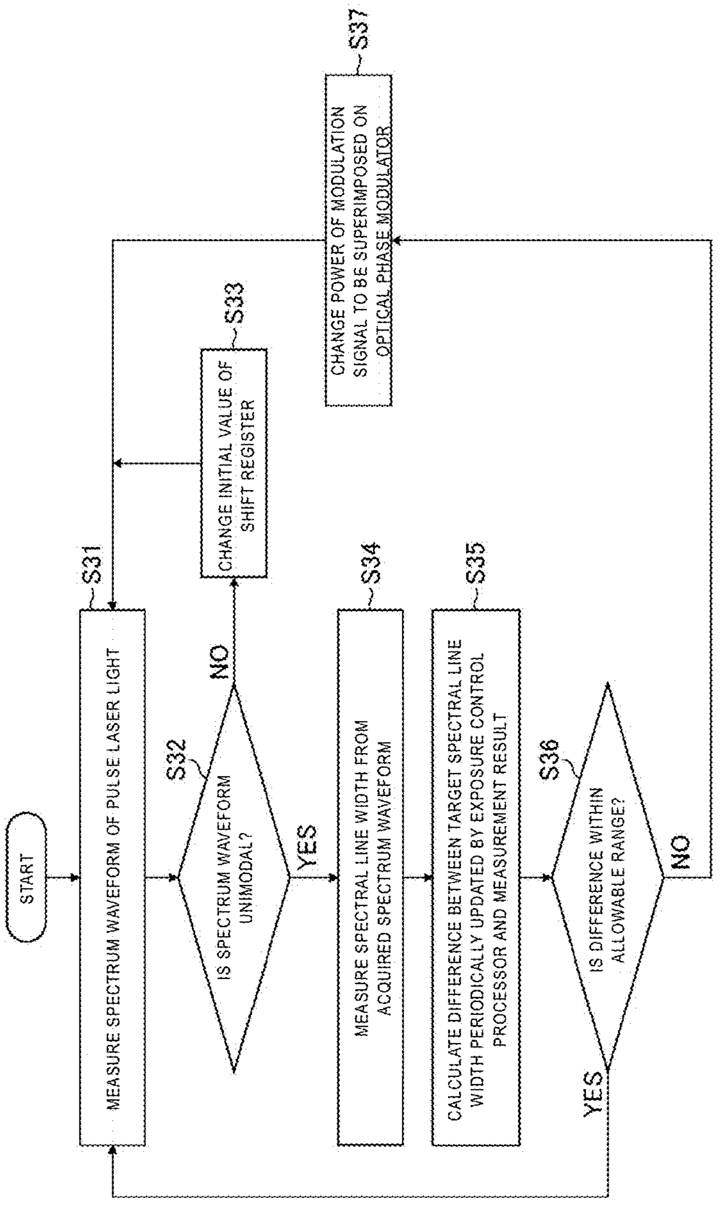
FIG. 20 is a flowchart showing a control example of the spectral line width in the fourth embodiment.

FIG. 20 is a flowchart showing a control example of the spectral line width in the fourth embodiment. Instead of the flowchart shown in FIG. 17, the flowchart shown in FIG. 20 is applied. In step S31 of FIG. 20, the laser control processor 50 measures the spectrum waveform of the pulse laser light PL3, which is the power of the excimer amplifier 30, using the spectrum monitor 146 of the monitor module 40.

In step S32, the laser control processor 50 determines whether the measured spectral shape is unimodal or multimodal and determines whether or not the spectrum waveform is unimodal. When the determination result of step S32 is NO, that is, when the spectral shape is multimodal, the laser control processor 50 proceeds to step S33.

In step S33, the laser control processor 50 changes the initial value of the shift register 360 via the solid-state seeder control processor 112 and returns to step S31.

On the other hand, when the determination result of step S32 is YES, that is, when the spectral shape is unimodal, the laser control processor 50 proceeds to step S34.

In step S34, the laser control processor 50 measures the spectral line width from the acquired spectrum waveform.

In step S35, the laser control processor 50 calculates a difference between the target spectral line width periodically updated by the exposure control processor 86 and the measurement result in step S34.

In step S36, the laser control processor 50 determines whether or not the calculated difference is within an allowable range. When the determination result of step S36 is YES, that is, when the difference is within the allowable range, the laser control processor 50 returns to step S31.

On the other hand, when the determination result of step S36 is NO, that is, when the difference is outside the allowable range, the laser control processor 50 proceeds to step S37. Step S37 is similar to step S24 of FIG. 17. Note that, instead of adjusting the power of the modulation signal in step S37, the bandwidth of the modulation signal may be adjusted using the variable bandpass filter 164. After step S37, the laser control processor 50 returns to step S31. Other operation may be similar to the operation of the laser device according to the first embodiment.

9.3 Effect

According to the laser device of the fourth embodiment, by adjusting the initial value of the shift register 360, it is possible to always control the target spectral line width with a unimodal spectral shape. Further, as described with reference to FIG. 18, since the relationship between the square root of the power of the modulation signal and the spectral line width has high linearity, the control of the spectral line width can be performed more easily and with high accuracy.

Here, even when the bandwidth of the modulation signal is to be adjusted instead of step S37 shown in FIG. 20, since the relationship between the bandwidth of the modulation signal and the spectral line width has high linearity, the control of the spectral line width can be performed more easily and with high accuracy.

10. Fifth Embodiment

10.1 Configuration

The configuration of the laser device according to a fifth embodiment is similar to the configuration of the laser device according to the fourth embodiment. The laser device according to the fifth embodiment differs from the laser device according to the fourth embodiment in the content of the control performed by the laser control processor 50.

10.2 Operation

The operation of the laser device according to the fifth embodiment will be described in terms of differences from the operation of the laser device according to the fourth embodiment. The laser device according to the fifth embodiment coarsely adjusts the spectral line width of the pulse laser light PL3 by changing the bandwidth of the modulation signal to be superimposed on the optical phase modulator 104, and finely adjusts the spectral line width of the pulse laser light PL3 by changing the power of the modulation signal. The fine adjustment is adjustment with a smaller adjustment amount than the coarse adjustment. For example, the range of the adjustment amount of the spectral line width adjustable by the fine adjustment may be equal to or less than 0.4 pm, and the range of the adjustment amount of the spectral line width adjustable by the coarse adjustment may be greater than 0.4 pm and equal to or less than 3 pm.

The laser control processor 50 of the laser device according to the fifth embodiment determines whether to perform the coarse adjustment or the fine adjustment according to the magnitude of the difference between the target spectral line width and the measured spectral line width. The fine adjustment may be performed when the difference from the target value is outside the allowable range and equal to or less than 0.4 pm (hereinafter, within the allowable range of the fine adjustment), and the coarse adjustment may be performed when the difference from the target value is outside the allowable range and greater than 0.4 pm and equal to or less than 3 pm (hereinafter, within the allowable range of the coarse adjustment).

Figure 21:
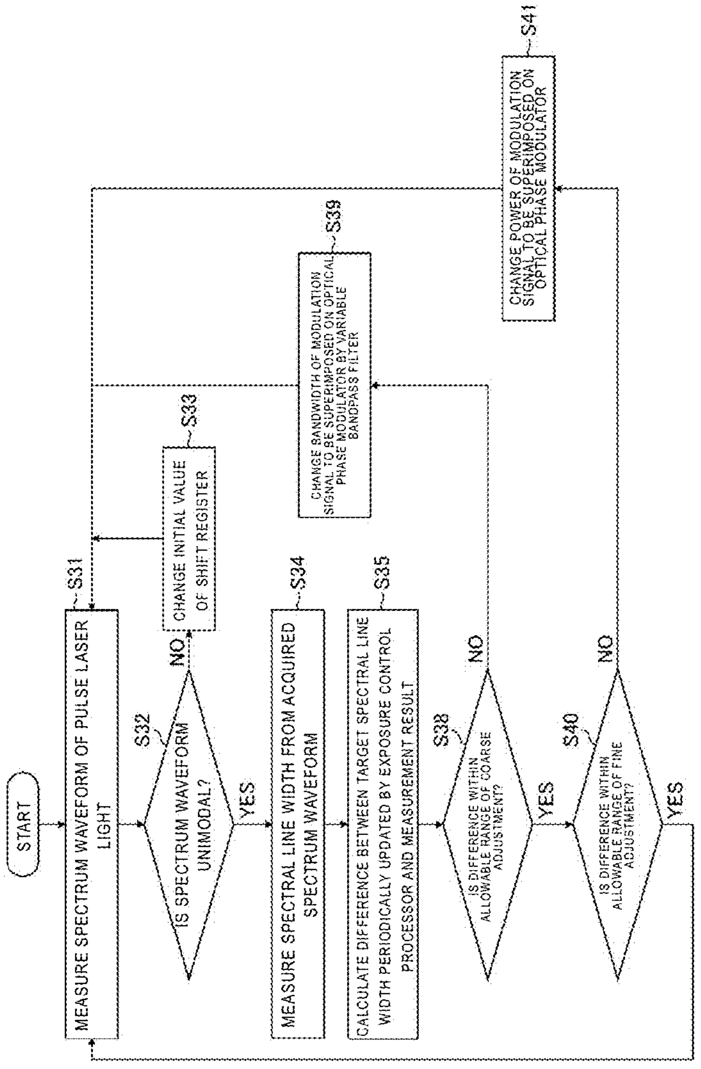
FIG. 21 is a flowchart showing a control example of the spectral line width in a fifth embodiment.

FIG. 21 is a flowchart showing a control example of the spectral line width in the fifth embodiment. Instead of the flowchart shown in FIG. 20, the flowchart shown in FIG. 21 is applied. The flowchart shown in FIG. 21 will be described in terms of differences from that shown in FIG. 20.

The flowchart shown in FIG. 21 includes steps S38 to S41 instead of steps S36 and S37 shown in FIG. 20.

After step S35, in step S38, the laser control processor 50 determines whether or not the difference calculated in step S35 is within the allowable range of the coarse adjustment. When the determination result of step S38 is NO, that is, when the difference is outside the allowable range of the coarse adjustment, the laser control processor 50 proceeds to step S39.

In step S39, the laser control processor 50 changes the bandwidth of the modulation signal to be superimposed on the optical phase modulator 104 by the variable bandpass filter 164. In step S39, the method of the first embodiment is applied. The operation of step S39 may be performed by the solid-state seeder control processor 112 in accordance with the command of the laser control processor 50. After step S39, the laser control processor 50 returns to step S31.

When the determination result of step S38 is YES, that is, when the difference is within the allowable range of the coarse adjustment, the laser control processor 50 proceeds to step S40. In step S40, the laser control processor 50 determines whether or not the difference calculated in step S35 is within the allowable range of the fine adjustment. When the determination result of step S40 is YES, that is, when the difference is within the allowable range of the fine adjustment, the laser control processor 50 returns to step S31.

When the determination result of step S40 is NO, that is, when the difference is outside the allowable range of the fine adjustment, the laser control processor 50 proceeds to step S41. Step S41 is similar to step S24 of FIG. 17. After step S41, the laser control processor 50 returns to step S31. Other operation may be similar to the operation of the laser device of the fourth embodiment.

10.3 Effect

According to the laser device of the fifth embodiment, by adjusting the initial value of the shift register 360, it is possible to always control the target spectral line width with a unimodal spectral shape. Further, in the laser device according to the fifth embodiment, the bandwidth of the modulation signal is changed when the spectral line width is to be coarsely adjusted, and the power of the modulation signal is changed when the spectral line width is to be finely adjusted, so that the amount of changing the power of the modulation signal is smaller than when the spectral line width is controlled only by the power of the modulation signal. Therefore, the stability of the entire modulation signal generator including pseudo-random signal the generator 111 is improved and the thermal load applied to the optical phase modulator 104 and the like is small, and stable control is possible.

Further, compared with the case in which the spectral line width is controlled only by the bandwidth of the modulation signal, the setting resolution can be finer when the power of the modulation signal is changed.

11. Example of Optical Phase Modulator

Figure 22:
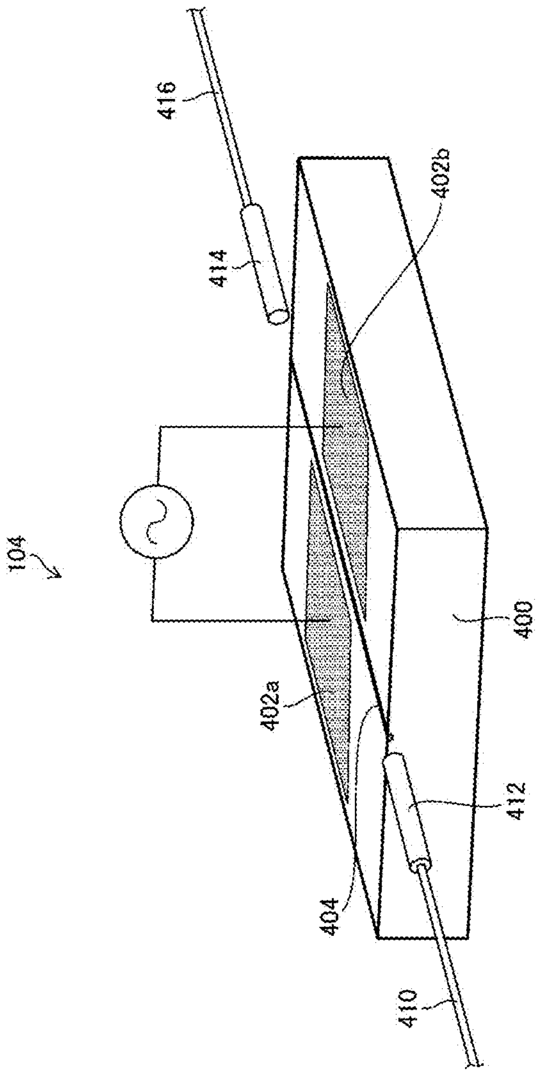
FIG. 22 schematically shows an example of an optical phase modulator.

FIG. 22 schematically shows an example of the optical phase modulator 104. The optical phase modulator 104 is an electro-optical (EO) modulator, and modulates the phase of a laser pulse by applying a voltage signal, which is a phase-modulation signal, to an electro-optical element (e.g., lithium niobate). In the optical phase modulator 104 shown in FIG. 22, electrodes 402*a*, 402*b* are arranged on a surface of a lithium niobate crystal 400 with an optical waveguide 404 interposed therebetween, and a voltage signal is applied between the electrodes 402*a*, 402*b*.

An input-side optical fiber 410 and a lens 412 are arranged on the optical input port side of the optical phase modulator 104, and a lens 414 and an output-side optical fiber 416 are arranged on the optical output port side. The lens 412 and the lens 414 are arranged to face each other with the lithium niobate crystal 400 interposed therebetween. The laser light guided by the input-side optical fiber 410 is input to the lithium niobate crystal 400 via the lens 412. The laser light having passed through the optical waveguide 404 enters the output-side optical fiber 416 via the lens 414, and is guided to the solid-state amplifier 106 (see FIG. 4) by the output-side optical fiber 416.

12. Combination of Exposure Apparatus and Laser Device

Instead of the laser device 11 used together with the exposure apparatus 80 shown in FIG. 16, a semiconductor device may be manufactured by applying the laser device according to any of the third to fifth embodiments.

13. Others

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious to those skilled in the art that the embodiments of the present disclosure would be appropriately combined.

The terms used throughout the present specification and the appended claims should be interpreted as non-limiting terms unless clearly described. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of any thereof and any other than A, B, and C.

What is claimed is:

1. A laser device comprising:

a semiconductor laser configured to output continuous light;

a first amplifier configured to amplify the continuous light and convert the continuous light to pulse light in synchronization with a light emission trigger signal received from an external apparatus;

an optical phase modulator arranged on an optical path of the continuous light between the semiconductor laser and the first amplifier;

a modulation signal generator configured to output a modulation signal to be provided to the optical phase modulator; and a processor configured to control the modulation signal generator, the processor causing the modulation signal generator to generate the modulation signal having an identical pattern in synchronization with the light emission trigger signal and provide the modulation signal having the identical pattern to the optical phase modulator so as to modulate a wavelength of the continuous light within a time period corresponding to one pulse of the pulse light and adjust a spectral line width of the pulse light.

2. The laser device according to claim 1, wherein the modulation signal is a pseudo-random signal.

3. The laser device according to claim 2, wherein the modulation signal generator includes a shift register.

4. The laser device according to claim 3, wherein the modulation signal generator includes a variable bandpass filter.

5. The laser device according to claim 4, wherein the processor adjusts the spectral line width by controlling a passband of the variable bandpass filter.

6. The laser device according to claim 5, wherein the processor changes a cutoff frequency of the variable bandpass filter to a high frequency side when the spectral line width is smaller than a target spectral line width, and changes the cutoff frequency of the variable bandpass filter to a low frequency side when the spectral line width is larger than the target spectral line width.

7. The laser device according to claim 1, wherein the modulation signal is a frequency sweep signal.

8. The laser device according to claim 7, wherein the modulation signal generator includes a sweet frequency generator.

9. The laser device according to claim 8, wherein the modulation signal generator includes a voltage control oscillator whose oscillation frequency changes in accordance with a voltage applied thereto.

10. The laser device according to claim 8, wherein the modulation signal generator sweeps a frequency at a constant sweep speed within the time period corresponding to the one pulse.

11. The laser device according to claim 8, further comprising an optical bandpass filter on the optical path between the optical phase modulator and the first amplifier.

12. The laser device according to claim 8, wherein the processor adjusts the spectral line width by controlling a sweep width of the frequency sweep signal.

13. The laser device according to claim 12, wherein the processor increases the sweep width when the spectral line width is smaller than a target spectral line width, and decreases the sweep width when the spectral line width is larger than the target spectral line width.

14. The laser device according to claim 1, further comprising a wavelength conversion system configured to output a second pulse laser light as converting a wavelength of first pulse laser light output from the first amplifier.

15. The laser device according to claim 14, wherein the wavelength conversion system includes a plurality of nonlinear crystals, and the second pulse laser light having an ultraviolet wavelength is output from the wavelength conversion system.

16. The laser device according to claim 14, further comprising a second amplifier configured to amplify the second pulse laser light.

17. The laser device according to claim 1, further comprising a measurement instrument configured to measure a spectral line width of the pulse laser light pulse-amplified by the first amplifier, wherein the processor controls the modulation signal generator so that the spectral line width measured by the measurement instrument becomes a target spectral line width.

18. The laser device according to claim 1, wherein the first amplifier includes a semiconductor optical amplifier.

19. The laser device according to claim 16, wherein the second amplifier includes an excimer amplifier.

20. An electronic device manufacturing method, comprising:

generating laser light having an ultraviolet wavelength using a laser device;

outputting the laser light to an exposure apparatus; and exposing a photosensitive substrate to the laser light in the exposure apparatus to manufacture an electronic device, the laser device including:

a semiconductor laser configured to output continuous light;

a first amplifier configured to amplify the continuous light and convert the continuous light to pulse light in synchronization with a light emission trigger signal received from an external apparatus;

an optical phase modulator arranged on an optical path of the continuous light between the semiconductor laser and the first amplifier;

a modulation signal generator configured to output a modulation signal to be provided to the optical phase modulator;

a processor configured to control the modulation signal generator; and a wavelength conversion system configured to output second pulse laser light as converting a wavelength of first pulse laser light output from the first amplifier, and the processor causing the modulation signal generator to generate the modulation signal having an identical pattern in synchronization with the light emission trigger signal and provide the modulation signal having the identical pattern to the optical phase modulator so as to modulate a wavelength of the continuous light within a time period corresponding to one pulse of the pulse light and adjust a spectral line width of the pulse light.

21. A laser device comprising:

a semiconductor laser configured to output continuous light;

a first amplifier configured to amplify the continuous light and convert the continuous light to pulse light in synchronization with a light emission trigger signal received from an external apparatus;

an optical phase modulator arranged on an optical path of the continuous light between the semiconductor laser and the first amplifier;

a modulation signal generator configured to output a modulation signal to be provided to the optical phase modulator; and a processor configured to control the modulation signal generator, the processor causing the modulation signal generator to generate the modulation signal having an identical pattern in synchronization with the light emission trigger signal and provide the modulation signal having the identical pattern to the optical phase modulator so as to modulate a wavelength of the continuous light within a time period corresponding to one pulse of the pulse light, and to adjust a power of the modulation signal so as to adjust a spectral line width of the pulse light.

22. The laser device according to claim 21, wherein the processor increases the power of the modulation signal when the spectral line width is smaller than a target spectral line width, and decreases the power of the modulation signal when the spectral line width is larger than the target spectral line width.

23. The laser device according to claim 22, wherein the processor determines the power of the modulation signal based on a function indicating a relationship between a square root of the power of the modulation signal and the spectral line width.

24. The laser device according to claim 22, wherein the processor determines the power of the modulation signal based on table data indicating a relationship between a square root of the power of the modulation signal and the spectral line width.

25. The laser device according to claim 21, wherein the modulation signal generator includes a shift register and an initial value setting circuit, and the processor sets an initial value of the shift register so that a spectrum modulated by the optical phase modulator becomes unimodal.

26. The laser device according to claim 21, wherein the processor coarsely adjusts the spectral line width by adjusting a bandwidth of the modulation signal and finely adjusts the spectral line width by adjusting the power of the modulation signal.

27. The laser device according to claim 21, wherein the modulation signal generator includes a third amplifier configured to adjust the power of the modulation signal with a control signal from the processor.

28. The laser device according to claim 21, wherein the modulation signal generator includes a variable attenuator configured to adjust the power of the modulation signal with a control signal from the processor.

29. An electronic device manufacturing method, comprising:

generating laser light having an ultraviolet wavelength using a laser device;

outputting the laser light to an exposure apparatus; and exposing a photosensitive substrate to the laser light in the exposure apparatus to manufacture an electronic device, the laser device including:

a semiconductor laser configured to output continuous light;

a first amplifier configured to amplify the continuous light and convert the continuous light to pulse light in synchronization with a light emission trigger signal received from an external apparatus;

an optical phase modulator arranged on an optical path of the continuous light between the semiconductor laser and the first amplifier;

a modulation signal generator configured to output a modulation signal to be provided to the optical phase modulator; and a processor configured to control the modulation signal generator, and the processor causing the modulation signal generator to generate the modulation signal having an identical pattern in synchronization with the light emission trigger signal and provide the modulation signal having the identical pattern to the optical phase modulator so as to modulate a wavelength of the continuous light within a time period corresponding to one pulse of the pulse light, and to adjust a power of the modulation signal so as to adjust a spectral line width of the pulse light.

* * * * *